United States Patent
Hirosaki et al.

(10) Patent No.: US 9,458,379 B2
(45) Date of Patent: Oct. 4, 2016

(54) PHOSPHOR, METHOD FOR MANUFACTURING SAME, LIGHT EMITTING DEVICE, AND IMAGE DISPLAY DEVICE

(71) Applicant: National Institute for Materials Science, Tsukaba-shi, Ibaraki (JP)

(72) Inventors: Naoto Hirosaki, Tsukaba (JP); Takashi Takeda, Ibaraki (JP); Shiro Funahashi, Tsukaba (JP)

(73) Assignee: National Institute for Materials Science, Tsukuba-shi (JP)

(*) Notice: Subject to any disclaimer, the term of this patent is extended or adjusted under 35 U.S.C. 154(b) by 0 days.

(21) Appl. No.: 14/368,927

(22) PCT Filed: May 30, 2013

(86) PCT No.: PCT/JP2013/065032
§ 371 (c)(1),
(2) Date: Jun. 26, 2014

(87) PCT Pub. No.: WO2013/180216
PCT Pub. Date: Dec. 5, 2013

(65) Prior Publication Data
US 2015/0070875 A1  Mar. 12, 2015

(30) Foreign Application Priority Data

May 31, 2012  (JP) .................. 2012-124019

(51) Int. Cl.
*C09K 11/59* (2006.01)
*C09K 11/08* (2006.01)
(Continued)

(52) U.S. Cl.
CPC ........ *C09K 11/7792* (2013.01); *C09K 11/7706* (2013.01); *C09K 11/7721* (2013.01);
(Continued)

(58) Field of Classification Search
CPC .......... C09K 11/0883; C09K 11/7734; H01L 33/502; H01L 33/504; F21K 9/56; G02F 1/133603; G02F 2001/133614; H01J 17/49; H01J 19/57
See application file for complete search history.

(56) References Cited

U.S. PATENT DOCUMENTS

2006/0192178 A1  8/2006 Hirosaki
2007/0007494 A1  1/2007 Hirosaki et al.
(Continued)

FOREIGN PATENT DOCUMENTS

JP   A 2005112922 A   4/2005
JP   B3668770         4/2005
(Continued)

OTHER PUBLICATIONS

Korean Patent Office Office Action dated Feb. 22, 2016.

*Primary Examiner* — Carol M Koslow
(74) *Attorney, Agent, or Firm* — Trojan Law Offices

(57) ABSTRACT

A chemically and thermally stable phosphor having unconventional light emitting properties and high light emitting intensity with an LED of 470 nm or less, includes an inorganic compound comprising: a crystal designated by $A_3(D,E)_8X_{14}$, a crystal designated by $Sr_3Si_8O_4N_{10}$ or an inorganic crystal having the identical crystal structure of the $Sr_3Si_8O_4N_{10}$ crystal, which comprises A element, D element, X element, and optionally E element if necessary (A is one or more kinds selected from Li, Mg, Ca, Sr, and Ba; D is one or more kinds selected from Si, Ge, Sn, Ti, Zr, and Hf; X is one or more kinds selected from O, N, and F; and E is one or more kinds selected from B, Al, Ga, In, Sc, Y, and La.), into which M element is solid-solved (M is one or more kinds selected from Mn, Ce, Pr, Nd, Sm, Eu, Tb, Dy, and Yb.).

35 Claims, 5 Drawing Sheets

Crystal structure of $Sr_3Si_8O_4N_{10}$

(51) Int. Cl.

| | |
|---|---|
| *C09K 11/63* | (2006.01) |
| *C09K 11/64* | (2006.01) |
| *H01J 1/63* | (2006.01) |
| *H01L 33/50* | (2010.01) |
| *C09K 11/77* | (2006.01) |
| *H01J 29/20* | (2006.01) |
| *H01J 11/42* | (2012.01) |
| *C30B 1/04* | (2006.01) |
| *C30B 29/34* | (2006.01) |
| *F21K 99/00* | (2016.01) |
| *G02F 1/1335* | (2006.01) |
| *H01J 17/49* | (2012.01) |
| *H01J 19/57* | (2006.01) |

(52) U.S. Cl.
CPC ........ *C09K11/7734* (2013.01); *C09K 11/7749* (2013.01); *C09K 11/7764* (2013.01); *C30B 1/04* (2013.01); *C30B 29/34* (2013.01); *F21K 9/56* (2013.01); *G02F 1/133603* (2013.01); *H01J 11/42* (2013.01); *H01J 17/49* (2013.01); *H01J 19/57* (2013.01); *H01J 29/20* (2013.01); *H01L 33/502* (2013.01); *G02F 2001/133614* (2013.01); *H01L 33/504* (2013.01); *H01L 2224/45144* (2013.01); *H01L 2224/48091* (2013.01); *H01L 2224/8592* (2013.01); *H01L 2924/12044* (2013.01); *H01L 2924/181* (2013.01)

(56) References Cited

U.S. PATENT DOCUMENTS

| | | |
|---|---|---|
| 2007/0018567 A1 | 1/2007 | Hirosaki |
| 2007/0108896 A1 | 5/2007 | Hirosaki |
| 2008/0303409 A1 | 12/2008 | Hirosaki |
| 2009/0236969 A1 | 9/2009 | Hirosaki |
| 2011/0121234 A1 | 5/2011 | Hirosaki |

FOREIGN PATENT DOCUMENTS

| | | |
|---|---|---|
| JP | B 3668770 B2 | 4/2005 |
| JP | B3837551 | 8/2006 |
| JP | B 3837551 B2 | 8/2006 |
| JP | B 3837588 B2 | 8/2006 |
| JP | B 3921545 B2 | 3/2007 |
| JP | B4524368 | 6/2010 |
| JP | B 4524368 B2 | 6/2010 |
| KR | 10-2007-0046795 | 5/2007 |
| WO | WO 2005019376 A | 3/2005 |
| WO | WO2006/003964 | 1/2006 |
| WO | WO 2006101096 A | 9/2006 |
| WO | WO 2007066733 A | 6/2007 |

Crystal structure of $Sr_3Si_8O_4N_{10}$

PHOSPHOR, METHOD FOR MANUFACTURING SAME, LIGHT EMITTING DEVICE, AND IMAGE DISPLAY DEVICE

CROSS REFERENCE TO RELATED APPLICATIONS

This application is a U.S. National Stage application under 35 U.S.C. 371, and claims priority to International Application No. PCT/JP2013/065032, filed May 30, 2013, which claims priority to Japanese Patent Application No. 2012-124019, filed May 31, 2012, the contents of both are herein incorporated by reference in their entireties.

TECHNICAL FIELD

The present invention relates to a phosphor, a manufacture thereof, and an application thereof, wherein the phosphor comprises: an inorganic compound comprising: a crystal designated by $A_3(D,E)_8X_{14}$, a crystal designated by $Sr_3Si_8O_4N_{10}$, an inorganic crystal having the identical crystal structure of the $Sr_3Si_8O_4N_{10}$ crystal, or a solid solution crystal of these, which comprises A element, D element, X element, and optionally E element if necessary (here, A is one or two or more kinds of elements selected from the group consisting of Li, Mg, Ca, Sr, and Ba; D is one or two or more kinds of elements selected from the group consisting of Si, Ge, Sn, Ti, Zr, and Hf; X is one or two or more kinds of elements selected from the group consisting of O, N, and F; and E is one or two or more kinds of elements selected from the group consisting of B, Al, Ga, In, Sc, Y, and La), into which M element is solid-solved (here, M is one or two or more kinds of elements selected from the group consisting of Mn, Ce, Pr, Nd, Sm, Eu, Tb, Dy, and Yb).

BACKGROUND ART

The phosphor is utilized in a fluorescent display tube (VFD: Vacuum-Fluorescent Display), a field emission display (FED: Field Emission Display) or SED (Surface-Conduction Electron-Emitter Display), a plasma display panel (PDP: Plasma Display Panel), a cathode-ray tube (CRT: Cathode-Ray Tube), a white light-emitting diode (LED: Light-Emitting Diode), and so on. In any of these applications, it is necessary to provide the phosphor with energy to excite the phosphor in order to make the phosphor emit fluorescence and the phosphor is excited by an excitation source with high energy such as a vacuum ultraviolet ray, an ultraviolet ray, an electron beam, and blue light so as to emit a visible light ray such as blue light, green light, yellow light, orange light, and red light. However, as a result of the phosphor being exposed to such excitation source, the luminance of the phosphor tends to decrease and a phosphor having little degradation in the brightness is desired. Therefore, a phosphor having an inorganic crystal containing nitrogen in a crystal structure thereof as a host crystal, instead a conventional phosphor such as a silicate phosphor, a phosphate phosphor, a aluminate phosphor, and a sulfide phosphor, has been proposed, as exemplified by a sialon phosphor, an oxynitride phosphor, or a nitride phosphor, which is characterized by low brightness deterioration caused by high energy excitation.

An example of the sialon phosphors is manufactured by a manufacturing process as generally described below. First, silicon nitride ($Si_3N_4$), aluminum nitride (AlN), and europium oxide ($Eu_2O_3$) are mixed in predetermined molar ratios and the resultant mixture is fired by a hot press method in one atmospheric pressure (0.1 MPa) of nitrogen atmosphere at 1700° C. for one hour (for example, refer to Patent Reference 1). It was reported that α-sialon activated with an Eu ion ($Eu^{2+}$) manufactured by the above processes had become a phosphor emitting yellow light in a wavelength range of 550 nm to 600 nm if excited by blue light having a wavelength range of 450 to 500 nm. And it is known that an emission wavelength may vary as a ratio of Si to Al or a ratio of oxygen to nitrogen is changed while the α-sialon crystal structure is maintained (for example, refer to Patent References 2 and 3).

As another example of the sialon phosphor, a green phosphor in which β type sialon is activated by $Eu^{2+}$ is known (refer to Patent Reference 4). It is known that, in the phosphor, an emission wavelength thereof may shift to a shorter wavelength by changing the oxygen content while the crystal structure remains the same (for example, refer to Patent Reference 5). Moreover, it is known that a blue phosphor is to be formed when β-sialon is activated by $Ce^{3+}$ (for example, refer to Patent Reference 6).

As an example of an oxynitride phosphor, a blue phosphor having a JEM phase ($LaAl(Si_{6-z}Al_z)N_{10-z}O_z$) as a host crystal, which is activated by Ce (refer to Patent Reference 7), is known. It is known that, in the phosphor, an emission wavelength may shift to a longer wavelength as an excitation wavelength shifts to a longer wavelength by substituting partially La with Ca while the crystal structure is maintained.

As another example of the oxynitride phosphor, a blue phosphor having a La—N crystal $La_3Si_8N_{11}O_4$ as a host crystal, which is activated by Ce, is known (refer to Patent Reference 8).

As an example of the nitride phosphor, a red phosphor having a crystal of $CaAlSiN_3$ as a host crystal, which is activated by $Eu^{2+}$, is known (refer to Patent Reference 9). Color rendering properties of a white LED are improved by utilizing this phosphor. A phosphor to which Ce was added as the activating element was reported to be an orange phosphor.

Thus, an emission color of the phosphor is determined by a combination of the crystal to act as the host crystal and a metal ion (activating ion) being incorporated into the crystal as a solid solution. Further, the combination of the host crystal and the activating ion determines emission characteristics such as an emission spectrum and an excitation spectrum, chemical stability, and thermal stability such that a phosphor is regarded as another different phosphor when a host crystal thereof or an activating ion thereof is different. Moreover, a material having a different crystal structure is different in the emission characteristics or in the stability because the host crystal is different even if the material has the same chemical composition such that the material is regarded as another different phosphor.

Further, kinds of constituent elements can be substituted in many phosphors while the same crystal structure of the host crystal is maintained, thereby changing the emission color. For example, although a phosphor having a YAG crystal to which Ce is added emits light of a green color, a phosphor having a YAG crystal in which Y is partially substituted with Gd and Al is partially substituted with Ga exhibits emission of a yellow color. Further, in a phosphor having $CaAlSiN_3$ to which Eu is added, it is known that a composition thereof varies by partially substituting Ca with Sr while the same crystal structure is maintained such that the emission wavelength shifts to a shorter wavelength. In this way, such a phosphor in which element substitution is performed while the same crystal structure is maintained is regarded as a material of the same group.

From the described above, it is important to find a host crystal having a new crystal structure in developing a new phosphor and it is possible to propose a new phosphor by activating such a host crystal with an emission-causing metal ion to make the host crystal exhibit luminescence characteristics.

PRIOR ART REFERENCES

Patent References

[Patent Reference 1] Japanese Patent No. 3668770, Specification.
[Patent Reference 2] Japanese Patent No. 3837551, Specification.
[Patent Reference 3] Japanese Patent No. 4524368, Specification.
[Patent Reference 4] Japanese Patent No. 3921545, Specification.
[Patent Reference 5] International Publication No. WO2007/066733.
[Patent Reference 6] International Publication No. WO2006/101096.
[Patent Reference 7] International Publication No. WO2005/019376.
[Patent Reference 8] Japanese Patent Application Publication No. 2005-112922.
[Patent Reference 9] Japanese Patent No. 3837588, Specification.

SUMMARY OF THE INVENTION

Problem to be Solved by the Invention

The present invention aims to satisfy such demand and it is one of the objects to provide an inorganic phosphor that has emission characteristics (emission color and excitation characteristics, emission spectrum) different from those of a conventional phosphor, exhibits high emission intensity even when combined with an LED with a wavelength of 470 nm or less, and is chemically and thermally stable. It is another object of the present invention to provide a light-emitting device that utilizes such a phosphor and is excellent in durability and an image display device that utilizes such a phosphor and is excellent in durability.

Means to Solve the Problem

Under such a situation, the present inventors investigated in detail a phosphor having, as a host crystal, a new crystal containing nitrogen and a crystal in which a metal element or N in the crystal structure is substituted by another kind of element, so as to find out that an inorganic phosphor having, as the host crystal, a crystal designated by $Sr_3Si_8O_4N_{10}$, an inorganic crystal having an identical crystal structure to that of the crystal $Sr_3Si_8O_4N_{10}$, or a solid solution crystal of these emitted fluorescence of high brightness. Further, the present inventors found out that the inorganic phosphor having a specific composition exhibited the emission of yellow-to-red color.

Further, it was found that, by utilizing the phosphor, a white color light-emitting diode (light-emitting device) having a small temperature fluctuation and a high emission efficiency, an illuminating device using the same, and an image display device rendering bright coloration could be obtained.

The present inventors conducted an intensive investigation in consideration of the above-mentioned background so as to successfully provide a phosphor rendering emission with a high intensity of a specific wavelength region by implementing configurations as described below. Further, a phosphor having excellent emission characteristics was successfully manufactured by employing a method described below. Further, there were successfully provided a light-emitting device, an illuminating device, an image display device, a pigment, and an ultraviolet absorber having excellent features by implementing configurations as described below.

The phosphor according to the present invention may be a phosphor (hereinafter referred to as "phosphor (1)") including an inorganic compound comprising: at least A element, D element, and X element (here, A is one or two or more kinds of elements selected from the group consisting of Li, Mg, Ca, Sr, and Ba; D is one or two or more kinds of elements selected from the group consisting of Si, Ge, Sn, Ti, Zr, and Hf; and X is one or two or more kinds of elements selected from the group consisting of O, N, and F), wherein the inorganic crystal, if necessary, comprises: E element (here, E is one or two or more kinds of elements selected from the group consisting of B, Al, Ga, In, Sc, Y, and La), and wherein the inorganic crystal is constituted of a crystal designated by $Sr_3Si_8O_4N_{10}$ or a crystal having an identical crystal structure to a crystal structure of the crystal designated by $Sr_3Si_8O_4N_{10}$, into which M element is solid-solved (here, M is one or two or more kinds of elements selected from the group consisting of Mn, Ce, Pr, Nd, Sm, Eu, Tb, Dy, and Yb). The above-mentioned problem may be solved in this way.

According to this phosphor (1), it may be a phosphor (hereinafter referred to as "phosphor (2)") in which the inorganic crystal having the crystal structure identical to the crystal structure of the crystal designated by $Sr_3Si_8O_4N_{10}$ is a crystal having a composition designated by $A_3(D,E)_8X_{14}$, and the crystal designated by $A_3(D,E)_8X_{14}$, comprises: at least Sr or Ca as the A element and Si as the D element, Al as the E element if necessary, N as the X element, and O as the X element if necessary.

According to this phosphor (1) or (2), it may be a phosphor (hereinafter referred to as "phosphor (3)") in which the inorganic crystal having the crystal structure identical to the crystal structure of the crystal designated by $Sr_3Si_8O_4N_{10}$ is a crystal of $Sr_3Si_8O_4N_{10}$ or $Ca_3Si_8O_4N_{10}$.

According to any one of these phosphors (1) to (3), it may be a phosphor (hereinafter referred to as "phosphor (4)") in which the inorganic crystal having the crystal structure identical to the crystal structure of the crystal designated by $Sr_3Si_8O_4N_{10}$ is represented by a composition formula of $Sr_3Si_{8-x}Al_xN_{10-x}O_{4+x}$ or $Ca_3Si_{8-x}Al_xN_{10-x}O_{4+x}$ (where $0 \leq x \leq 8$).

According to any one of these phosphors (1) to (4), it may be a phosphor (hereinafter referred to as "phosphor (5)") in which the M element is Eu.

According to any one of these phosphors (1) to (5), it may be a phosphor (hereinafter referred to as "phosphor (6)") in which the inorganic crystal having the crystal structure identical to the crystal structure of the crystal designated by $Sr_3Si_8O_4N_{10}$ is a crystal in a monoclinic system.

According to any one of these phosphors (1) to (6), it may be a phosphor (hereinafter referred to as "phosphor (7)") in which the inorganic crystal having the crystal structure identical to the crystal structure of the crystal designated by $Sr_3Si_8O_4N_{10}$ is a crystal in a monoclinic system and has a symmetry in a space group $P2_1/n$, and lattice constants a, b, and c have values in the following ranges:

a=0.48170±0.05 nm;
b=2.42320±0.05 nm; and
c=1.05600±0.05 nm.

Here, "±0.05" indicates a tolerance and, with respect to 'a', for example, it can signify a range of 0.48170-0.05≤a≤0.48170+0.05 (the same will apply hereinafter).

According to any one of these phosphors (1) to (7), it may be a phosphor (hereinafter referred to as "phosphor (8)") in which the inorganic compound is represented by a composition formula of $M_dA_eD_fE_gX_h$ (here, d+e+f+g+h=1 in the formula; M is one or two or more kinds of elements selected from the group consisting of Mn, Ce, Pr, Nd, Sm, Eu, Tb, Dy, and Yb; A is one or two or more kinds of elements selected from the group consisting of Li, Mg, Ca, Sr, and Ba; D is one or two or more kinds of elements selected from the group consisting of Si, Ge, Sn, Ti, Zr, and Hf; E is one or two or more kinds of elements selected from the group consisting of B, Al, Ga, In, Sc, Y, and La; and X is one or two or more kinds of elements selected from the group consisting of O, N, and F), and wherein the parameters d, e, f, g, and h satisfy all the following conditions:

0.00001≤d≤0.05;

0.05≤e≤0.3;

0.15≤f≤0.4;

0≤g≤0.15; and 0.45≤h≤0.65.

According to the above phosphor (8), it may be a phosphor (hereinafter referred to as "phosphor (9)") in which values of the parameters d, e, f, g, and h are within a range satisfying all the conditions of:

d+e=(3/25)±0.05;

f+g=(8/25)±0.05; and h=(14/25)±0.05.

Here, "±0.05" indicates a tolerance and, with respect to 'd+e', for example, it can signify a range of (3/25)-0.05≤d+e≤(3/25)+0.05 (the same will apply hereinafter).

According to this phosphor (8) or (9), it may be a phosphor (hereinafter referred to as "phosphor (10)") in which values of the parameters f and g satisfy a condition of: 3/8≤f/(f+g)≤8/8.

According to any one of these phosphors (8) to (10), it may be a phosphor (hereinafter referred to as "phosphor (11)") in which the X element includes N and O, the inorganic compound is represented by a composition formula of $M_dA_eD_fE_gO_{h1}N_{h2}$ (here, d+e+f+g+h1+h2=1 and h1+h2=h in the formula), and the condition of 0/14≤h1/(h1+h2)≤8/14 is satisfied.

According to any one of these phosphors (1) to (11), it may be a phosphor (hereinafter referred to as "phosphor (12)") in which the M element includes at least Eu.

According to any one of these phosphors (1) to (12), it may be a phosphor (hereinafter referred to as "phosphor (13)") in which the A element includes at least Sr or Ca, the D element includes at least Si, the E element includes at least Al if necessary, and the X element includes at least N and O.

According to any one of these phosphors (1) to (13), it may be a phosphor (hereinafter referred to as "phosphor (14)") in which the inorganic compound is represented by a composition formula with parameters x and y of: $Eu_ySr_{3-y}Si_{8-x}Al_xN_{10-x}O_{4+x}$ or $Eu_yCa_{3-y}Si_{8-x}Al_xN_{10-x}O_{4+x}$ wherein 0≤x<8 and 0.0001≤y≤2.

According to any one of these phosphors (1) to (14), it may be a phosphor (hereinafter referred to as "phosphor (15)") in which the inorganic compound includes a single crystal particle or an aggregate of single crystal particles having a mean particle diameter of at least 0.1 μm and not exceeding 20 μm.

According to any one of these phosphors (1) to (15), it may be a phosphor (hereinafter referred to as "phosphor (16)") in which a sum of Fe, Co, and Ni impurity elements does not exceed 500 ppm.

According to any one of these phosphors (1) to (16), it may be a phosphor (hereinafter referred to as "phosphor (17)") which further comprises an amorphous phase or another crystal phase that is different from the inorganic compound in addition to the inorganic compound (collectively, referred to as "second phase"), wherein a content amount of the inorganic compound is equal to or more than 20 mass %.

According to this phosphor (17), it may be a phosphor (hereinafter referred to as "phosphor (18)") in which the other crystal phase or the amorphous phase (second phase) is an inorganic substance having electronic conductivity.

According to this phosphor (18), it may be a phosphor (hereinafter referred to as "phosphor (19)") in which the inorganic substance having the electrical conductivity is oxide, oxynitride, or nitride, any one of which includes one or two or more kinds of elements selected from a group consisting of Zn, Al, Ga, In, and Sn; or a mixture thereof.

According to any one of these phosphors (17) to (19), it may be a phosphor (hereinafter referred to as "phosphor (20)") in which the other crystal phase or the amorphous phase (second phase) is another inorganic phosphor (hereinafter referred to as "second compound") that is different from the inorganic compound.

According to any one of these phosphors (1) to (20), it may be a phosphor (hereinafter referred to as "phosphor (21)") in which the phosphor emits fluorescent having a peak in a wavelength range of at least 560 nm and not exceeding 650 nm upon irradiation of an excitation source.

According to this phosphor (21), it may be a phosphor (hereinafter referred to as "phosphor (22)") in which the excitation source is an electron beam; an X-ray or light having a wavelength that is at least 100 nm and not exceeding 450 nm, such as vacuum ultraviolet rays, ultraviolet rays or visible light.

According to any one of these phosphors (1) to (22), it may be a phosphor (hereinafter referred to as "phosphor (23)") in which the inorganic crystal constituted of a crystal designated by $Sr_3Si_8O_4N_{10}$ or the inorganic crystal having an identical crystal structure as the crystal designated by $Sr_3Si_8O_4N_{10}$, into which Eu is solid-solved, and the phosphor emits fluorescent of yellow-to-red color having a wavelength of at least 560 nm and not exceeding 650 nm upon irradiation of light having a wavelength from 360 nm to 450 nm.

According to any one of these phosphors (1) to (23), it may be a phosphor (hereinafter referred to as "phosphor (24)") in which a color of light emitted upon irradiation of an excitation source satisfies, in terms of values of (x0, y0) of CIE 1931 chromaticity coordinates, conditions: 0.1≤x0≤0.7; and 0.2≤y0≤0.9. Here, values of CIE 1931 chromaticity coordinates are normally shown in the form of (x, y). However, in order to avoid confusion with x and y, which are used in the composition formula, x is represented by x0 and y is represented by y0 (the same will apply hereinafter).

A method of manufacturing any one of the above phosphors (1) to (24) of the present invention may be a manufacturing method (hereinafter referred to as "manufacturing method (25)") comprising: firing a raw material mixture of metal compounds, which constitutes each of the above inorganic compounds of phosphors (1) to (24) by firing the mixture, in an inert atmosphere including nitrogen in a temperature range of at least 1,200° C. and not exceeding 2,200° C. The above-mentioned problem may be solved in this way.

According to the above manufacturing method (25), it may be a manufacturing method (hereinafter referred to as "manufacturing method (26)"), in which the mixture of metal compounds comprises: a compound including M, a compound including A, a compound including D, a compound including X, and, if necessary, a compound including E (wherein M is one or two or more kinds of elements selected from a group consisting of Mn, Ce, Pr, Nd, Sm, Eu, Tb, Dy, and Yb; A is one or two or more kinds of elements selected from a group consisting of Li, Mg, Ca, Sr, and Ba; D is one or two or more kinds of elements selected from a group consisting of Si, Ge, Sn, Ti, Zr, and Hf; E is one or two or more kinds of elements selected from a group consisting of B, Al, Ga, In, Sc, Y, and La; and X is one or two or more kinds of elements selected from a group consisting of O, N, and F).

According to the above manufacturing method (25) or (26), it may be a manufacturing method (hereinafter referred to as "manufacturing method (27)"), in which the compound including M is a single kind of substance or a mixture of at least two kinds of substances selected from a group consisting of metal, silicide, oxide, carbonate, nitride, oxynitride, chloride, fluoride and oxyfluoride, each of which includes M; the compound including A is a single kind of substance or a mixture of at least two kinds of substances selected from a group consisting of metal, silicide, oxide, carbonate, nitride, oxynitride, chloride, fluoride, and oxyfluoride, each of which includes A; and the compound including D is a single kind of substance or a mixture of at least two kinds of substances selected from a group consisting of metal, silicide, oxide, carbonate, nitride, oxynitride, chloride, fluoride, and oxyfluoride, each of which includes D.

According to any one of these manufacturing methods (25) to (27), it may be a manufacturing method (hereinafter referred to as "manufacturing method (28)"), in which the mixture of metal compounds includes at least nitride or oxide of europium; nitride, oxide, or carbonate of strontium; and silicon oxide or silicon nitride.

According to any one of these manufacturing methods (25) to (28), it may be a manufacturing method (hereinafter referred to as "manufacturing method (29)"), in which the inert atmosphere including nitrogen is a nitrogen gas atmosphere in a pressure range of at least 0.1 MPa and not exceeding 100 MPa.

According to any one of these manufacturing methods (25) to (29), it may be a manufacturing method (hereinafter referred to as "manufacturing method (30)"), in which graphite is used in a sample container, a heat-insulating element, or a heating element of a firing furnace.

According to any one of these manufacturing methods (25) to (30), it may be a manufacturing method (hereinafter referred to as "manufacturing method (31)"), in which the step of firing is performed after the metal compounds in a form of powder or aggregate are filled in a container as being maintained with a filling rate of 40% or less in a bulk density.

According to any one of these manufacturing methods (25) to (31), it may be a manufacturing method (hereinafter referred to as "manufacturing method (32)"), in which a container used for the step of firing is made of boron nitride.

According to any one of these manufacturing methods (25) to (32), it may be a manufacturing method (hereinafter referred to as "manufacturing method (33)"), in which a mean particle diameter of powder particles or aggregates of the metal compounds is 500 μm or less.

According to any one of these manufacturing methods (25) to (33), it may be a manufacturing method (hereinafter referred to as "manufacturing method (34)"), in which a mean particle diameter of aggregates of the metal compounds is controlled to be 500 μm or less by means of a spray dryer, sieving, or pneumatic classification.

According to any one of these manufacturing methods (25) to (34), it may be a manufacturing method (hereinafter referred to as "manufacturing method (35)"), in which sintering means is means of pressureless sintering or gas pressure sintering, but not by means of hot pressing.

According to any one of these manufacturing methods (25) to (35), it may be a manufacturing method (hereinafter referred to as "manufacturing method (36)"), in which a mean particle diameter of phosphor powder synthesized by firing is controlled to be at least 50 nm and not exceeding 20 μm by one or more techniques selected from pulverization, classification, and acid treatment.

According to any one of these manufacturing methods (25) to (36), it may be a manufacturing method (hereinafter referred to as "manufacturing method (37)"), in which a phosphor powder after firing, a phosphor powder after pulverization treatment, or a phosphor powder after particle size adjustment is heat-treated at a temperature that is equal to or higher than 1,000° C. and equal to or lower than a firing temperature.

According to any one of these manufacturing methods (25) to (37), it may be a manufacturing method (hereinafter referred to as "manufacturing method (38)"), in which another inorganic compound to produce a liquid phase at a temperature equal to or less than the firing temperature is added to the mixture of metal compounds, which is then fired in the firing step.

According to any one of these manufacturing methods (25) to (38), it may be a manufacturing method (hereinafter referred to as "manufacturing method (39)"), in which the other inorganic compound to produce the liquid phase at the temperature equal to or less than the firing temperature is a mixture of one or two or more kinds of substances selected from a group consisting of fluoride, chloride, iodide, bromide, and phosphate of one or two or more elements selected from a group consisting of Li, Na, K, Mg, Ca, Sr, and Ba.

According to any one of these manufacturing method (38) or (39), it may be a manufacturing method (hereinafter referred to as "manufacturing method (40)"), in which a content amount of the other inorganic compound to produce the liquid phase at the temperature equal to or less than the firing temperature is reduced by washing with a solvent after the step of firing.

It may be a light-emitting device (hereinafter referred to as "light-emitting device (41)") comprising at least a light-emitting body and a phosphor (hereinafter referred to as "first phosphor"), wherein any one of the above-mentioned phosphors (1) to (24) is used as the phosphor (first phosphor).

According to the above light-emitting device (41), it may be a light-emitting device (hereinafter referred to as "light-emitting device (42)"), in which the light-emitting body is an organic EL light-emitting body (OLED), a semiconductor laser, a laser diode (LD), or a light-emitting diode (LED), any of which emits light of a wavelength of 330 to 500 nm.

According to the above light-emitting device (41) or (42), it may be a light-emitting device (hereinafter referred to as "light-emitting device (43)"), in which the light-emitting device is a white light-emitting diode, an illuminating device including a plurality of white light-emitting diodes, or a backlight for a liquid crystal panel.

According to any one of the above light-emitting devices (41) to (43), it may be a light-emitting device (hereinafter referred to as "light-emitting device (44)"), in which the light-emitting body emits ultraviolet or visible light having a peak wavelength of 300 to 450 nm and which is characterized by emitting white light or light other than the white light by mixing blue to red light emitted by the above-recited phosphor (first phosphor) and light having a wavelength of 450 nm or more emitted by another phosphor (second phosphor).

According to any one of the above light-emitting devices (41) to (44), it may be a light-emitting device (hereinafter referred to as "light-emitting device (45)"), which further comprises a blue phosphor (third phosphor) being caused to emit light having a peak wavelength of 420 nm to 500 nm or less by the light-emitting body. This may mean that, for example, the second phosphor includes the third phosphor.

According to the above light-emitting devices (45), it may be a light-emitting device (hereinafter referred to as "light-emitting device (46)"), in which the blue phosphor is selected from a group consisting of AlN:(Eu, Si), $BaMgAl_{10}O_{17}$:Eu, $SrSi_9AL_{19}ON_{31}$:Eu, $LaSi_9Al_{19}N_{32}$:Eu, α-sialon:Ce, and JEM:Ce.

According to any one of the above light-emitting devices (41) to (46), it may be a light-emitting device (hereinafter referred to as "light-emitting device (47)"), which further comprises a green phosphor being caused to emit light having a peak wavelength of at least 500 nm and not exceeding 550 nm by the light-emitting body.

According to the above light-emitting devices (47), it may be a light-emitting device (hereinafter referred to as "light-emitting device (48)"), in which the green phosphor is selected from a group consisting of β-sialon:Eu, $(Ba,Sr,Ca,Mg)_2SiO_4$:Eu, and $(Ca,Sr,Ba)Si_2O_2N_2$:Eu.

According to any one of the above light-emitting devices (41) to (48), it may be a light-emitting device (hereinafter referred to as "light-emitting device (49)"), which further comprises a yellow phosphor (fourth phosphor) being caused to emit light having a peak wavelength of at least 550 nm and not exceeding 600 by the light-emitting body. This may mean that, for example, the second phosphor includes the fourth phosphor.

According to the above light-emitting devices (49), it may be a light-emitting device (hereinafter referred to as "light-emitting device (50)"), in which the yellow phosphor (fourth phosphor) is selected from a group consisting of YAG:Ce, α-sialon:Eu, $CaAlSiN_3$:Ce, and $La_3Si_6N_{11}$:Ce.

According to any one of the above light-emitting devices (41) to (50), it may be a light-emitting device (hereinafter referred to as "light-emitting device (51)"), which further comprises a red phosphor (fifth phosphor) being caused to emit light having a peak wavelength of at least 600 nm and not exceeding 700 nm by the light-emitting body. This may mean that, for example, the second phosphor includes the fifth phosphor.

According to the above light-emitting device (51), it may be a light-emitting device (hereinafter referred to as "light-emitting device (52)"), in which the red phosphor (fifth phosphor) is selected from a group consisting of $CaAlSiN_3$:Eu, $(Ca,Sr)AlSiN_3$:Eu, $Ca_2Si_5N_8$:Eu, and $Sr_2Si_5N_8$:Eu. Here, the formula: $(Ca, Sr)AlSiN_3$:Eu means both Ca and Sr are required in the compound as expressed for the simplicity throughout the specification. On the other hand, the formulas: $(Ba,Sr,Ca,Mg)_2SiO_4$:Eu and $(Ca,Sr,Ba)Si_2O_2N_2$:Eu conventionally mean the compounds contain at least one of the elements listed in the parenthesis.

According to any one of the above light-emitting devices (41) to (52), it may be a light-emitting device (hereinafter referred to as "light-emitting device (53)"), in which the light-emitting body is an LED for emitting light having a wavelength of 320 to 450 nm.

An image display device according to the present invention may be an image display device, which comprises an excitation source and a phosphor (first phosphor) and in which at least one of the above-recited phosphors (1) to (24) is used as the phosphor (first phosphor).

According to the above image display device, it may be an image display device, which is any one of a fluorescent display tube (VFD), a field emission display (FED), a plasma display panel (PDP), a cathode-ray tube (CRT), and a liquid crystal display (LCD).

A pigment according to the present invention may comprises the inorganic compound recited in any one of the above-recited phosphors (1) to (24).

An ultraviolet absorber according to the present invention may comprises the inorganic compound recited in any one of the above-recited phosphors (1) to (24).

Effects of the Invention

According to the present application, a workable phosphor may be made by incorporating M element into a crystal designated by $Sr_3Si_8O_4N_{10}$, a crystal having an identical crystal structure to a crystal structure of the crystal designated by $Sr_3Si_8O_4N_{10}$, or a solid solution crystal of these (hereinafter collectively referred to as "$Sr_3Si_8O_4N_{10}$ system crystal") which is a host crystal as a solid solution. The phosphor according to the present invention exhibits an emission of high brightness by including such an inorganic compound as a main component, and is excellent as a yellow-to-red phosphor with a specific composition. Since the brightness of the phosphor does not decrease even when exposed to the excitation source, the present invention provides a useful phosphor suitably used for a light-emitting device such as a white light-emitting diode, an illuminating device, a backlight source for a liquid crystal, VFD, FED, PDP or CRT. Further, the phosphor absorbs ultraviolet light, and thus the phosphor is suitable for a pigment and ultraviolet absorber.

EMBODIMENT FOR CARRYING OUT THE INVENTION

Hereafter, a phosphor according to the present invention is described in detail with reference to the drawings.

A phosphor according to the present invention comprises: an inorganic compound, as a main component, comprising: a crystal designated by $Sr_3Si_8O_4N_{10}$, an inorganic crystal having an identical crystal structure to a crystal structure of the crystal designated by $Sr_3Si_8O_4N_{10}$, or a solid solution crystal of theses, into which an M element is solid-solved (here, M is one or two or more kinds of elements selected from the group consisting of Mn, Ce, Pr, Nd, Sm, Eu, Tb, Dy, and Yb), wherein the crystal, the inorganic crystal or the solid solution crystal comprises: at least an A element, a D element, and an X element (here, A is one or two or more kinds of elements selected from the group consisting of Li, Mg, Ca, Sr, and Ba; D is one or two or more kinds of elements selected from the group consisting of Si, Ge, Sn, Ti, Zr, and Hf; and X is one or two or more kinds of elements selected from the group consisting of O, N, and F), and wherein the crystal, the inorganic crystal or the solid solution crystal, if necessary, comprises: an E element (here, E is one or more kinds of elements selected from the group consisting of B, Al, Ga, In, Sc, Y, and La). In this way, phosphors to emit light of blue-to-red color may be provided.

The crystal designated by $Sr_3Si_8O_4N_{10}$, which was newly synthesized and confirmed to be a new crystal through the crystal structure analysis by the present inventors, is a crystal which has not been reported prior to the present invention.

Figure 1:
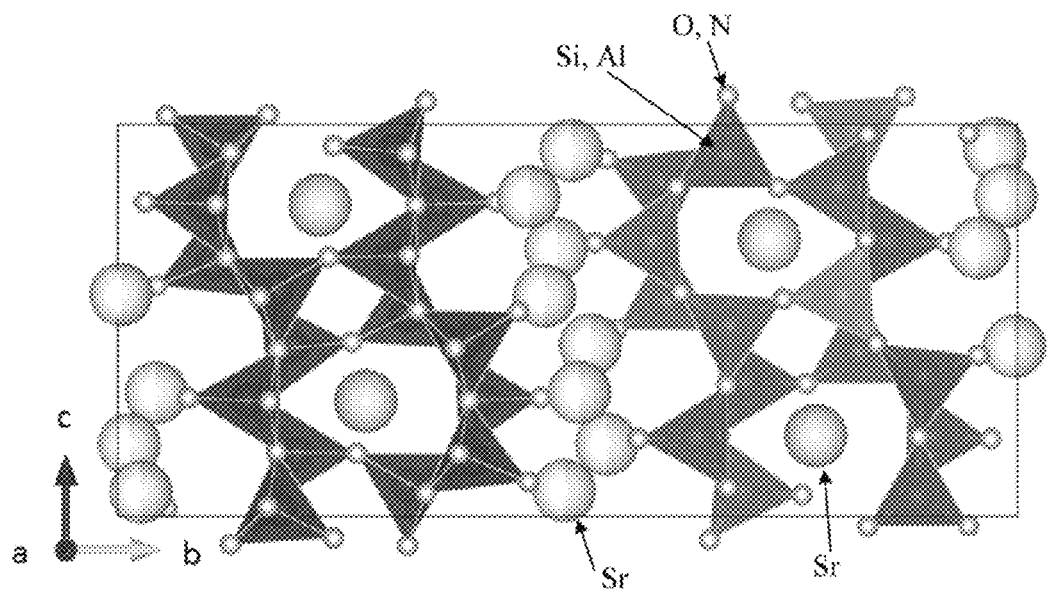
FIG. 1 is a diagram illustrating a crystal structure of $Sr_3Si_8O_4N_{10}$ crystal.

FIG. 1 is a diagram showing a crystal structure of $Sr_3Si_8O_4N_{10}$ crystal.

According to the single crystal structure analysis performed with respect to the $Sr_3Si_8O_4N_{10}$ crystal synthesized by the present inventors, the $Sr_3Si_8O_4N_{10}$ crystal belongs to the monoclinic system and the $P2_1/n$ space group (space group No. 14 in the International Tables for Crystallography), and has crystal parameters and occupancy of the atomic coordinate positions as shown in Table 1.

In Table 1, lattice constants a, b, and c signify respective lengths of the axes of the unit cell, and α, β, and γ signify respective angles between axes of the unit cell. The atomic coordinates indicate a position of each atom in the unit cell in terms of a value between 0 and 1 using the unit cell as a unit. According to the analysis results thus obtained, there were atoms of Sr, Si, O, and N, respectively and Sr existed in five kinds of sites: (Sr(1) to Sr(5)). Also, Si existed in eight kinds of sites: (Si(1) to Si(8)) according to the analysis results. Further, according to the analysis results, O and N existed in fourteen (14) kinds of similar sites: (O, N(1) to O, N(14)).

TABLE 1

| Crystal structure data of $Sr_3Si_8O_4N_{10}$ crystal | | | | |
|---|---|---|---|---|
| Crystal composition | | $Sr_3Si_8O_4N_{10}$ | | |
| Formula weight (Z) | | 4 | | |
| Crystal system | | Monoclinic | | |
| Space group | | P2(1)/n | | |
| Space group number | | 14 | | |
| Lattice constants | a | 4.817 | Å | |
| | b | 24.232 | Å | |
| | c | 10.56 | Å | |
| | α | 90 | degree | |
| | β | 90.6 | degree | |
| | γ | 90 | degree | |

| Atom | Atomic coordinate | | | Site occupancy rate |
|---|---|---|---|---|
| | x | y | z | |
| Sr(1) | 0.0837 | 0.2243 | 0.2057 | 1 |
| Sr(2) | −0.6326 | −0.0255 | 0.0625 | 0.5 |
| Sr(3) | −0.1412 | 0.013 | −0.1833 | 0.5 |
| Sr(4) | −0.1182 | −0.0431 | 0.3153 | 0.5 |
| Sr(5) | 0.3828 | −0.0039 | 0.566 | 0.5 |
| Si(1) | −0.4093 | 0.0949 | 0.2033 | 1 |
| Si(2) | −0.4106 | 0.1804 | −0.0141 | 1 |
| Si(3) | −0.4142 | 0.3027 | 0.3411 | 1 |
| Si(4) | 0.0876 | 0.1107 | 0.0499 | 1 |
| Si(5) | 0.086 | 0.1043 | 0.3562 | 1 |
| Si(6) | −0.4108 | 0.3064 | 0.0663 | 1 |
| Si(7) | 0.0835 | 0.3557 | 0.2025 | 1 |
| Si(8) | −0.4153 | 0.1765 | 0.4211 | 1 |
| O, N(1) | −0.3426 | 0.2402 | 0.0555 | 1 |
| O, N(2) | −0.2605 | 0.3318 | 0.2069 | 1 |
| O, N(3) | −0.3723 | 0.2345 | 0.3393 | 1 |
| O, N(4) | −0.2619 | 0.1257 | 0.0714 | 1 |
| O, N(5) | −0.2619 | 0.1211 | 0.3393 | 1 |
| O, N(6) | −0.7651 | 0.3224 | 0.0728 | 1 |
| O, N(7) | −0.2616 | 0.3425 | −0.059 | 1 |
| O, N(8) | −0.2631 | 0.1766 | −0.1653 | 1 |
| O, N(9) | −0.763 | 0.1097 | 0.2038 | 1 |
| O, N(10) | −0.7658 | 0.1666 | −0.0251 | 1 |
| O, N(11) | 0.1088 | 0.4216 | 0.1978 | 1 |
| O, N(12) | −0.353 | 0.0296 | 0.1971 | 1 |
| O, N(13) | 0.1392 | 0.0547 | −0.0231 | 1 |
| O, N(14) | 0.127 | 0.0435 | 0.4115 | 1 |

As a result of analysis using data in Table 1, the $Sr_3Si_8O_4N_{10}$ crystal was found to have the structure as shown in FIG. 1, in which Sr element is included in a skeleton formed by linking tetrahedrons constituted of bonds of Si with O or N. The M element to become an activating ion such as Eu is incorporated into the crystal in the type of partial substitution of the Sr element.

As an inorganic crystal having a crystal structure identical to the crystal structure of $Sr_3Si_8O_4N_{10}$ crystal, which was synthesized and subjected to the structure analysis, there are $A_3(D,E)_8X_{14}$ crystal, $A_3Si_8O_4N_{10}$ crystal, and $A_3(Si,Al)_8(O,N)_{14}$ crystal. The A element is typically Sr, Ca, or a mixture of Sr and Li.

In $A_3(D,E)_8X_{14}$ crystal, A can occupy sites which Sr is supposed to occupy, D and E can occupy sites which Si is supposed to occupy, and X can occupy sites which O and N are supposed to occupy in $Sr_3Si_8O_4N_{10}$ crystal. Thus, a relative ratio of numbers of atoms can be adjusted to 3 for the A element, 8 for the sum of D and E, and 14 for the sum of X while the crystal structure remains the same. However, it is desirable to have a ratio of cation such as A, D, and E to anion such as X satisfying an electrical neutrality condition in the crystal.

In $A_3(Si, Al)_8(O, N)_{14}$ crystal, A can occupy sites which Sr is supposed to occupy, Si and Al can occupy sites which Si is supposed to occupy, and O and N can occupy sites which N is supposed to occupy in $Sr_3Si_8O_4N_{10}$ crystal. Thus, a relative ratio of numbers of atoms can be adjusted to 3 for the A element, 8 for the sum of Si and Ai, and 14 for the sum of O and N while the crystal structure remains the same. However, it is desirable to have a ratio of Si/Al and a ratio of O/N satisfying an electrical neutrality condition in the crystal.

The $Sr_3Si_8O_4N_{10}$ system crystal of the present invention can be identified by means of the X-ray diffraction or the neutron diffraction. A substance exhibiting the identical diffraction to that of the $Sr_3Si_8O_4N_{10}$ system crystal as a result of the X-ray diffraction in the present invention includes a crystal designated by $A_3 (D, E)_8 X_{14}$. Further, the substance includes a crystal in which lattice constants or atomic positions are changed by substituting other elements for constituent elements in the $Sr_3Si_8O_4N_{10}$ crystal. Here, specific examples of materials in which the constituent elements are substituted with other elements include a material in which Sr in the $Sr_3Si_8O_4N_{10}$ crystal is partially or completely substituted with the A element other than Sr (here, A is one or two or more kinds of elements selected from Li, Mg, Ca, Sr, and Ba) or the M element (here, M is one or two or more kinds of elements selected from Mn, Ce, Pr, Nd, Sm, Eu, Tb, Dy, and Yb). Further, the specific examples include a material in which Si in the crystal is partially or completely substituted with the D element other than Si (here, D is one or two or more kinds of elements selected from Si, Ge, Sn, Ti, Zr, and Hf). Further, the specific examples include a material in which O or N in the crystal is partially or completely substituted with N and/or fluorine or O and/or fluorine, respectively. These substitutions are performed such that neutrality of charges in the whole crystal is maintained. A material in which a crystal structure thereof is not changed as a result of such element substitutions is included in the $Sr_3Si_8O_4N_{10}$ system crystal. Since emission characteristics, chemical stability, and thermal stability of the phosphor are changed by the substitution of elements, the substitution of elements may be selectively utilized at an appropriate time for each application thereof as far as the crystal structure remains the same.

In the $Sr_3Si_8O_4N_{10}$ system crystal, the lattice constants change as the constituent components are substituted with other elements or as an activating element such as Eu is solid-solved therein, but the atomic positions given by the crystal structure, sites to be occupied by atoms, and coordinates thereof do not significantly change to an extent in which a chemical bond between skeleton atoms is broken. In the present invention, a crystal structure is defined to be identical to that of $Sr_3Si_8O_4N_{10}$ crystal if lengths of chemical bonds (distance of neighboring atoms) of Al—N and Si—N calculated from the lattice constants and atomic coordinates obtained by conducting Rietveld analysis of the results from the X-ray diffraction or the neutron diffraction in the space group of $P2_1/n$ are compared with lengths of chemical bonds calculated from the lattice constants and atomic coordinates of $Sr_3Si_8O_4N_{10}$ crystal as shown in Table 1 such that each difference between corresponding lengths is within ±5%, and using the definition it is determined whether the crystal having the crystal structure belongs to the $Sr_3Si_8O_4N_{10}$ system crystal or not. This determination criterion is employed herein since it was once observed that a crystal in the $Sr_3Si_8O_4N_{10}$ system crystal was changed to become another crystal due to breakage of chemical bonds when lengths of the chemical bonds were changed beyond ±5% according to the prior experiments.

Further, in case an amount of solid-solution is small, a simple method for determining whether it belongs to the $Sr_3Si_8O_4N_{10}$ system crystal or not is described as follows. A new substance can be identified to have the same crystal structure if main peaks of the resultant X-ray diffraction pattern measured with the new substance are respectively located at diffraction peak positions, which agree with the peak positions (2θ) of the diffraction pattern calculated using the crystal structure data of Table 1 and the lattice constants calculated from the resultant X-ray diffraction pattern.

Figure 2:
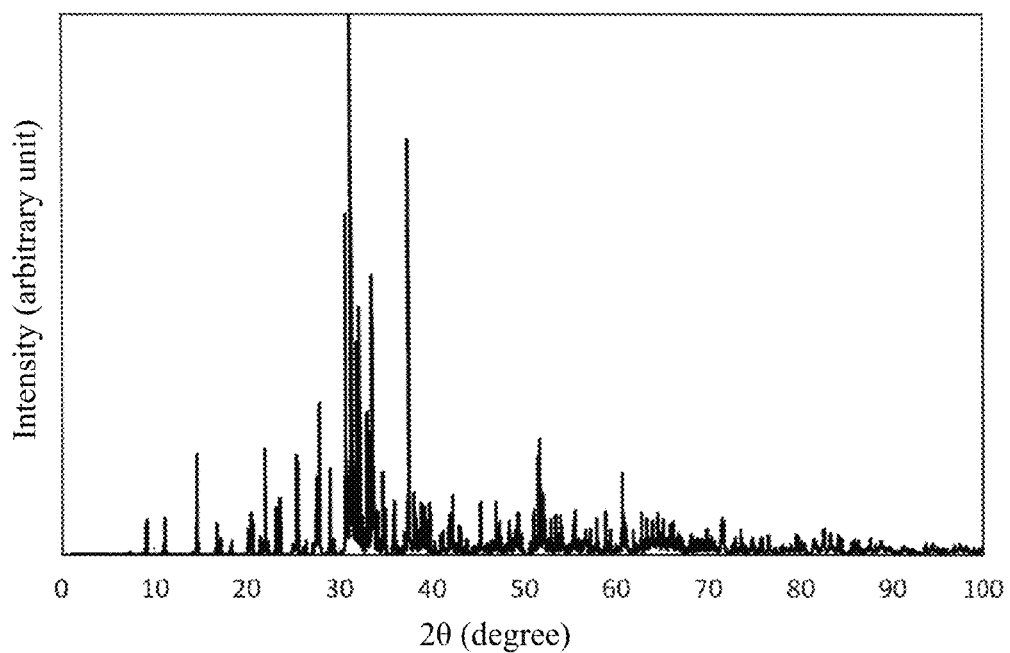
FIG. 2 is a diagram showing a powder X-ray diffraction pattern using Cu Kα-line, calculated from a crystal structure of $Sr_3Si_8O_4N_{10}$ crystal.

FIG. 2 is a diagram showing a powder X-ray diffraction pattern using Cu Kα-line calculated from the crystal structure of $Sr_3Si_8O_4N_{10}$ crystal.

Since synthesized compound through an actual synthesis is obtained in a powder state, the spectra of the thus-obtained synthesized compound are compared to those of FIG. 2 and it can be determined whether the synthesized compound belongs to $Sr_3Si_8O_4N_{10}$ crystal or not.

It is possible to make a simple determination whether a subject substance belongs to the $Sr_3Si_8O_4N_{10}$ system crystal or not by comparing FIG. 2 and that of the subject substance. It may be good to make a judgment using approximately ten (10) peaks of the highest intensity in the diffraction pattern as the main peaks of the $Sr_3Si_8O_4N_{10}$ system crystal. Table 1 is important in this sense since it could be referenced when the identification of the $Sr_3Si_8O_4N_{10}$ system crystal is conducted. Further, it is also possible to define a crystal structure of the $Sr_3Si_8O_4N_{10}$ system crystal as an approximate structure using another crystal system of the monoclinic crystal and, in such a case, the crystal structure is expressed using a different space group, different lattice constants, and different plane indices, but the X-ray diffraction results (for example, FIG. 2) and the crystal structure (for example, FIG. 1) remain unchanged such that an identification method and an identification result thereof are the same. Therefore, in the present invention, it is to perform an X-ray diffraction analysis using the monoclinic system. The method of identifying the substance based on Table 1 will be concretely described in Examples to be described later, and the explanation of the method described herein is just in general.

A phosphor can be obtained if the $Sr_3Si_8O_4N_{10}$ system crystal is activated by the M element, one or two or more kinds of which are selected from Mn, Ce, Pr, Nd, Sm, Eu, Tb, Dy, Ho, Er, Tm, and Yb. Since emission characteristics such as an excitation wavelength, an emission wavelength, and emission intensity may vary depending on the composition of the $Sr_3Si_8O_4N_{10}$ system crystal, and the kind and quantity of the activating element, such conditions may be chosen in accordance with an application thereof.

With respect to a crystal designated by $A_3 (D,E)_8 X_{14}$, when the crystal has a composition in which, at least, the A element includes either Sr or Ca, the D element includes Si, the E element includes Al if necessary, the X element includes N, and the X element includes O if necessary, then the crystal exhibits high emission intensity. In particular, it is the phosphor exhibiting high emission intensity that includes $Sr_3Si_8(O,N)_{14}$ crystal as the host crystal and has a composition in which A is Sr, D is Si, and X is a combination of O and N.

The phosphor in which an inorganic crystal thereof having a crystal structure identical to that of the crystal designated by $Sr_3Si_8O_4N_{10}$ is $Sr_3Si_8O_4N_{10}$, $Ca_3Si_8O_4N_{10}$, or $(Sr,Li)_3Si_8O_4N_{10}$, exhibits high emission intensity as the crystal is stable.

The phosphor in which an inorganic crystal thereof having a crystal structure identical to that of the crystal designated by $Sr_3Si_8O_4N_{10}$ includes, as a host crystal, a crystal designated by a composition formula: $Sr_3Si_{8-x}Al_xN_{10-x}O_{4+x}$, $Ca_3Si_{8-x}Al_xN_{10-x}O_{4+x}$, or $(Sr,Li)_3Si_{8-x}Al_xN_{10-x}O_{4+x}$ (here, $0 \leq x < 8$) is a phosphor which exhibits high emission intensity and can be controlled in the color change of the emission by changing a composition thereof.

It is Eu that is used as the activating M element such that a phosphor exhibiting particularly high emission intensity can be obtained.

In an inorganic crystal having a crystal structure identical to that of the crystal designated by $Sr_3Si_8O_4N_{10}$, the inorganic crystal is particularly stable if the inorganic crystal is a crystal that belongs to the monoclinic system, and a phosphor having such crystal as a host crystal exhibits high emission intensity.

Further, if an inorganic crystal having a crystal structure identical to that of the crystal designated by $Sr_3Si_8O_4N_{10}$ is a crystal that belongs to the monoclinic system and has the symmetry of space group $P2_1/n$, and in which lattice constants thereof a, b, and c are in the following range:
a=0.48170±0.05 nm;
b=2.42320±0.05 nm; and
c=1.05600±0.05 nm,
the crystal is particularly stable such that a phosphor having such inorganic crystal as a host crystal exhibits high emission intensity. If a crystal is prepared out of the above range, the crystal may become unstable and the emission intensity may occasionally decrease.

A phosphor in which an inorganic compound is designated by a composition formula $M_dA_eD_fE_gX_h$ (here, in the formula, d+e+f+g+h=1, M is one or two or more kinds of elements selected from Mn, Ce, Pr, Nd, Sm, Eu, Tb, Dy, and Yb; A is one or two or more kinds of elements selected from Li, Mg, Ca, Sr, and Ba; D is one or two or more kinds of elements selected from Si, Ge, Sn, Ti, Zr, and Hf; E is one or two or more kinds of elements selected from B, Al, Ga, In, Sc, Y, and La; X is one or two or more kinds of elements selected from O, N, and F), and parameters d, e, f, g, and h satisfy all conditions:

$0.00001 \leq d \leq 0.05$;

$0.05 \leq e \leq 0.3$;

$0.15 \leq f \leq 0.4$;

$0 \leq g \leq 0.15$; and $0.45 \leq h \leq 0.65$, exhibits particularly high emission intensity.

The parameter d represents an additive amount of the activating element, and if the amount is less than 0.00001, an amount of activating ions (light-emitting ions) is insufficient so as to cause brightness to decrease. If the amount is more than 0.05, the emission intensity may be decreased due to the concentration quenching by a mutual interaction between activating ion. The parameter e is a parameter representing a constituent amount of the A element such as Sr, and if the amount is less than 0.05 or higher than 0.3, the crystal structure becomes unstable so as to cause the emission intensity to decrease. The parameter f is a parameter representing a constituent amount of the D element such as Si, and if the amount is less than 0.15 or higher than 0.4, the crystal structure becomes unstable so as to cause the emission intensity to decrease. The parameter g is a parameter representing a constituent amount of the E element such as Al, and if the amount is higher than 0.15, the crystal structure becomes unstable so as to cause the emission intensity to decrease. The parameter h is a parameter representing a constituent amount of the X element such as O, N, and F, and if the amount is less than 0.45 or higher than 0.65, the crystal structure becomes unstable so as to cause the emission intensity to decrease. The X element is an anion, and composition ratios of O, N, and F are determined in order to maintain the charge neutrality with cations of the A, M, D and E elements.

A crystal, in which values of the parameters d, e, f, g, and h satisfy all conditions:

$d+e=(3/25)\pm 0.05$, $f+g=(8/25)\pm 0.05$, and $h=(14/25)\pm 0.05$, is stable in the crystal structure and exhibits particularly high emission intensity. In particular, the crystal, in which the values satisfy all conditions:

$d+e=3/25$, $f+g=8/25$, and $h=14/25$;

that is to say the crystal having $(M,A)_3(D,E)_8X_{14}$ composition, is especially stable in the crystal structure and exhibits particularly high emission intensity.

Further, the crystal having the composition, in which the parameters f and g satisfy the condition:

$3/8 \leq f/(f+g) \leq 8/8$, is stable in the crystal structure and exhibits high emission intensity.

The crystal, in which the X element includes N and O in the above composition formula, if it is represented by the composition formula: $M_dA_eD_fE_gO_{h1}N_{h2}$ (where d+e+f+g+h1+h2=1 and h1+h2=h.) and satisfies the condition: $0/14 \leq h1/(h1+h2) \leq 8/14$, is stable in the crystal structure and exhibits high emission intensity.

For example, the crystal, in which the M element is Eu and the parameters d to h satisfy the conditions:

$0.00001 \leq d \leq 0.05$, $0.1 \leq e \leq 0.2$, $0.25 \leq f \leq 0.35$, $g=0$, and $0.5 \leq h \leq 0.6$, in the above composition formula, could become a phosphor to emit yellow-to-red color.

A phosphor including at least Eu as the M element being the activating element is a phosphor exhibiting high emission intensity among the phosphors of the present invention, and the phosphor having a specific composition could be a yellow-to-red phosphor.

A phosphor having a composition, in which at least Sr or Ca is included as the A element; at least Si is included as the D element; at least Al is included as the E element if necessary; and at least O and N are included as the X element, has a stable crystal structure and emission intensity thereof is high. Here, 0.001 mass % to 1 mass % of boron may be further included as the E element. By this inclusion, the crystal structure becomes more stable and the emission intensity is increased.

The phosphor comprising the above-mentioned inorganic compound, in which a composition formula thereof may be represented, using parameters x and y, by: $Eu_ySr_{3-y}Si_{8-x}Al_xN_{10-x}O_{4+x}$, $Eu_yCa_{3-y}Si_{8-x}Al_xN_{10-x}O_{4+x}$, or $Eu_y(Sr,Li)_{3-y}Si_{8-x}Al_xN_{10-x}O_{4+x}$
wherein $0 \le x < 8$ and
$0.0001 \le y \le 2$,
can be kept in a stable crystal structure while a ratio of Eu/Sr, a ratio of Eu/Ca, a ratio of Eu/(Sr+Li), a ratio of Si/Al, and a ratio of N/O can be changed in the composition range by changing the parameters x and y. Thus, it is a phosphor that is easy to make a material design since an excitation wavelength thereof or an emission wavelength thereof can be continuously changed by utilizing this feature.

A phosphor in which an inorganic compound includes single crystal particles or an aggregate of the single crystals having a mean particle diameter of 0.1 µm or more to 20 µm or less has high emission efficiency and a good handling property when it is applied to an LED such that it is good to control the particle diameter thereof in this range.

Impurity elements of Fe, Co, and Ni included in the inorganic compound may cause the emission intensity to decrease. If the sum of these impurity elements in the phosphor is controlled to be 500 ppm or less, an influence of these elements on the emission intensity is decreased.

As one of the embodiments of the present invention, there is a phosphor constituted of a mixture of a phosphor having the $Sr_3Si_8O_4N_{10}$ system crystal as the host crystal and another kind of crystal phase or another kind of amorphous phase other than this system crystal wherein a content amount of the phosphor of the $Sr_3Si_8O_4N_{10}$ system crystal is 20 mass % or more. In the case where target characteristics cannot be obtained with a single phosphor of the $Sr_3Si_8O_4N_{10}$ system crystal by itself, or in the case where an additional function such as conductivity is added, the phosphor of the present embodiment may be utilized. The content amount of the $Sr_3Si_8O_4N_{10}$ system crystal phosphor may be adjusted in accordance with the target characteristics, but the emission intensity of the phosphor may be lowered if the content amount is less than 20 mass %. From this perspective, it is preferable to have 20 mass % or more of the main component of the above-mentioned inorganic compound in the phosphor of the present invention.

In the case where the phosphor is supposed to need electrical conductivity in an application in which electron beam excitation or the like is employed, an inorganic substance having electrical conductivity may be added thereto as another crystal phase or an amorphous phase.

As the inorganic substance having the electrical conductivity, oxide; oxynitride; or nitride of one or two or more kinds of elements selected from Zn, Al, Ga, In, and Sn, or a mixture of the above may be named. For example, zinc oxide, aluminum nitride, indium nitride, tin oxide, and so on may be named.

In the case where a target emission spectrum cannot be achieved with a single phosphor of the $Sr_3Si_8O_4N_{10}$ system crystal, a second phosphor other than the phosphor of the $Sr_3Si_8O_4N_{10}$ system crystal may be added. As examples of the other phosphors, a BAM phosphor, a β-sialon phosphor, an α-sialon phosphor, a $(Sr,Ba)_2Si_5N_8$ phosphor, a $CaAlSiN_3$ phosphor, and a $(Ca,Sr)AlSiN_3$ phosphor may be named.

As one of the embodiments of the present invention, there is a phosphor having a peak at a wavelength in the range of 560 nm to 650 nm by irradiation with an excitation source. For example, a phosphor of the $Sr_3Si_8O_4N_{10}$ system crystal in which Eu is activated has an emission peak in this range by adjusting the composition.

As one of the embodiments of the present invention, there is a phosphor emitting light with vacuum ultraviolet light, ultraviolet light, or visible light having a wavelength of 100 nm or more to 450 nm or less, or electron beam or X-ray as an excitation source. The phosphor can be made to emit light efficiently by using such excitation source.

As one of the embodiments of the present invention, there is a phosphor constituted of a crystal designated by $Sr_3Si_8O_4N_{10}$ and an inorganic crystal having a crystal structure identical to that of the crystal designated by $Sr_3Si_8O_4N_{10}$, into which Eu is solid-solved. Since the phosphor, by adjusting the composition, emits fluorescence of yellow-to-red color having a wavelength of at least 560 nm and not exceeding 650 nm upon irradiation of light having a wavelength from 360 nm to 450 nm, it may be good to be used in the application of yellow-to-red color emission of a white color LED or the like.

As one of the embodiments of the present invention, there is a phosphor in which a color of light emitted upon irradiation of an excitation source satisfies, in terms of values of (x0, y0) of CIE 1931 chromaticity coordinates, conditions:

$0.1 \le x0 \le 0.7$ and $0.2 \le y0 \le 0.9$.

For example, it is possible to obtain a phosphor emitting light of the color in the above range on the chromaticity coordinates by adjusting the composition given by $Eu_ySr_{3-y}Si_{8-x}Al_xN_{10-x}O_{4+x}$, which satisfies:

$0 \le x < 8$, and $0.0001 \le y \le 2$.

The obtained phosphor may be utilized in an application of yellow-to-red color emission of a white LED or the like.

Thus, as compared with an ordinary oxide phosphor or an existing sialon phosphor, the phosphor of the present invention is characterized by having a wider excitation range of an electron beam and X-ray and light from ultraviolet light to visible light, emitting light of blue-to-red color, in particular, yellow-to-red color from 560 nm to 650 nm with a specific composition thereof, and being capable of adjusting an emission wavelength and an emission peak width. Thus, the phosphor of the present invention is suitable for an illuminating device, an image display device, pigment, and an ultraviolet absorber because of such emission characteristics. The phosphor of the present invention has also advantages of excellent heat resistance since it does not degrade even if it is exposed to high temperature, and excellent long-term stability under an oxidizing atmosphere and a moisture environment, and thus a product having excellent durability can be provided by utilizing the phosphor.

A method of manufacturing such a phosphor of the present invention is not particularly limited thereto, but, for example, such a phosphor can be obtained by firing a mixture of metal compounds of a raw material mixture that can constitute an inorganic compound having the $Sr_3Si_8O_4N_{10}$ system crystal as the host crystal, into which the M element is solid-solved through firing, in a nitrogen-containing inert atmosphere within the temperature range of 1,200° C. or higher to 2,200° C. or lower. While the main crystal of the present invention belongs to the monoclinic system and the space group $P2_1/n$, another crystal that belongs to another crystal system and another space group other than the above may be occasionally mixed therein depending on synthesis conditions such as firing temperature. However, even in such a case, a change of the emission characteristics is slight and therefore the thus-obtained product can be used as a high brightness phosphor.

As a starting material, for example, a mixture of metal compounds, which comprises a compound including M, a compound including A, a compound including D, a compound including X, and a compound including E if necessary (here, M is one or two or more kinds of elements selected from Mn, Ce, Pr, Nd, Sm, Eu, Tb, Dy, and Yb; A is one or two or more kinds of elements selected from Li, Mg, Ca, Sr, and Ba; D is one or two or more kinds of elements selected from Si, Ge, Sn, Ti, Zr, and Hf; E is one or two or more kinds of elements selected from B, Al, Ga, In, Sc, Y, and La; and X is one or two or more kinds of elements selected from O, N, and F), may be satisfactorily used.

As the starting material, the mixture, which comprises the compound including M that is a single substance or a mixture of at least two kinds of substances selected from metal, silicide, oxide, carbonate, nitride, oxynitride, chloride, fluoride, or oxyfluoride including M; the compound including A that is a single substance or a mixture of at least two kinds of substances selected from metal, silicide, oxide, carbonate, nitride, oxynitride, chloride, fluoride, or oxyfluoride including A; and the compound including D that is a single substance or a mixture of at least two kinds of substances selected from a metal, silicide, oxide, carbonate, nitride, oxynitride, chloride, fluoride or oxyfluoride including D, is preferable because these raw materials are easily available and have excellent stability. The mixture, which comprises the compound including X that is a single substance or a mixture of at least two kinds of substances selected from oxide, nitride, oxynitride, fluoride, and oxyfluoride, is preferable because each raw material is easily available and has excellent stability. As the compound including E, a single substance or a mixture of at least two kinds of substances selected from metal, silicide, oxide, carbonate, nitride, oxynitride, chloride, fluoride, and oxyfluoride including E, can be used.

In the case where a phosphor of the $Sr_3Si_8O_4N_{10}$ crystal system activated by Eu is manufactured, it is preferable to use a starting material comprising, at least, nitride or oxide of europium; nitride, oxide, or carbonate of strontium; and silicon oxide or silicon nitride since the reaction tends to easily proceed during the firing.

Since the firing temperature is high and the firing atmosphere is an inert atmosphere containing nitrogen, an electric furnace of a metal resistance heating type or a graphite resistance heating type, in which a high temperature member of the furnace made of carbon is used, is suitable as a furnace for firing. The nitrogen-containing inert atmosphere in the pressure range of 0.1 MPa or more to 100 MPa or less is preferable because thermal decomposition of nitride or oxynitride of the starting material or the product is suppressed. It is preferable that the oxygen partial pressure is 0.0001% or lower in the firing atmosphere in order to suppress the oxidation reaction of nitride or oxynitride of the starting material or the product.

Here, the firing time is, depending on the firing temperature, usually 1 to 10 hours or so.

In order to manufacture the phosphor in the form of powder or aggregate, it is preferable to utilize a method of firing raw materials after the raw materials are filled in a container with a filling rate kept at the bulk density of 40% or lower. It is possible to prevent particles from adhering with each other by maintaining the bulk density of 40% or lower in the filling rate. Here, the term relative bulk density means the ratio of a value (bulk density) given by dividing the mass of powder material filled in the container by the capacity of the container to the real density of the substance of the powder material. Unless otherwise noted, the relative bulk density is referred to as simply the bulk density.

Various kinds of heat-resistant materials can be used for the container containing the raw material compound in firing the raw material mixture. However, in view of a low adverse effect of material deterioration on the metal nitride used in the present invention, a material suitably includes a boron nitride coated container, which is exemplified by a boron nitride coated graphite crucible used for synthesis of an α-sialon as described in a scientific journal "Journal of the American Ceramic Society" Vol. 85, No. 5, pages 1229 to 1234 in 2002, or boron nitride sintered body. When the firing is performed under such conditions, boron or boron nitride component is mixed into the product from the container, but, if the amount thereof is small, an effect of mixing is slight since the emission characteristics are not decreased. Further, durability of the product may be occasionally improved by the addition of a small amount of boron nitride thereto, and such addition may be preferable in some cases.

In order to manufacture the phosphor in the form of powder or aggregate, it is preferable to make the mean particle diameter of powder particles or aggregate of the raw material equal to or less than 500 μm since the raw material has excellent reactivity and handling characteristics.

As a method of adjusting a particle size of the particles or aggregates to be 500 μm or less, it is preferable to employ a spray dryer, sieving, or pneumatic classification since such a method has excellent operating efficiency and handling characteristics.

As a method of firing, not the hot-pressing, but a method of firing, in which no external mechanical pressing is applied, such as pressureless sintering method and gas pressure sintering method is preferable as a method of obtaining a product of powder or aggregate.

A mean particle diameter of phosphor powder is preferably 50 nm or more to 200 μm or less in terms of a volume-based median diameter (d50) because the emission intensity is high. The volume-based mean particle diameter can be measured, for example, according to a Microtrac or a laser light scattering method. A mean particle diameter of phosphor powder synthesized by firing may be satisfactorily adjusted to be 50 nm or more to 200 μm or less by applying at least one technique selected from pulverization, classification and acid treatment.

A defect or damage caused by pulverization included in powder may be occasionally cured by heat-treating of phosphor powder after firing, phosphor powder after pulverizing treatment, or phosphor powder after controlling a particle size at a temperature of 1,000° C. or higher to the firing temperature or lower. The defect or damage may occasionally cause a decrease in the emission intensity, and in such a case, the emission intensity recovers by the heat treatment.

During firing for synthesis of the phosphor, a stable crystal may be occasionally obtained by adding an inorganic compound forming a liquid phase at a temperature of a firing temperature or lower and firing a mixture thereof such that the liquid phase acts as a flux to promote the reaction and particle growth, and thus the emission intensity may be occasionally improved.

Specific examples of the inorganic compound forming the liquid phase at the temperature of the firing temperature or lower include a single substance or a mixture of two or more kinds of fluoride, chloride, iodide, bromide, or phosphate of one or two or more kinds of elements selected from Li, Na, K, Mg, Ca, Sr, and Ba. The inorganic compounds have different melting points, respectively, and therefore may be satisfactorily used properly depending on a synthesizing temperature.

Further, the emission intensity of the phosphor may occasionally become high by reducing the content amount of the inorganic compound forming the liquid phase at the temperature of the firing temperature or lower by washing the phosphor with a solvent after the firing.

When the phosphor of the present invention is used in an application of a light-emitting device or the like, it is preferable to use the phosphor dispersed in a liquid medium. Further, the phosphor can also be used in the form of a phosphor mixture containing the phosphor of the present invention. A composition prepared by dispersing the phosphor of the present invention in the liquid medium is referred to as a phosphor-containing composition.

As the liquid medium that can be used for the phosphor-containing composition of the present invention, any liquid medium can be selected depending on a purpose or the like, if the liquid medium shows liquid properties under desired use conditions to suitably disperse the phosphor of the present invention, and simultaneously does not cause an undesirable reaction or the like. Specific examples of the liquid medium include an addition reaction type silicone resin and a condensation reaction type silicone resin before curing, a modified silicone resin, an epoxy resin, a polyvinyl resin, a polyethylene resin, a polypropylene resin and a polyester resin. With respect to the liquid media, a single kind of liquid medium may be used by itself, or any combination of two or more kinds of liquid media with any combination ratio thereof may be used.

An amount of used liquid medium or media may be appropriately adjusted depending on an application or the like. In general, the amount is in the range of generally 3 wt % or more and preferably 5 wt % or more, to generally 30 wt % or less and preferably 15 wt % or less in terms of the weight ratio of the liquid medium to the phosphor of the present invention.

Further, the phosphor-containing composition of the present invention may contain, in addition to the phosphor of the present invention and the liquid medium, any other component depending on an application or the like. Specific examples of any other component include a dispersing agent, a thickening agent, an extending agent and a buffering agent. Specifically, the examples include silica fine powder such as Aerosil, and alumina.

The light-emitting device of the present invention is configured by using at least a light-emitting body or an emission source, and the phosphor of the present invention.

As the light-emitting body or the emission source, there are an LED light-emitting instrument, a laser diode (LD) light-emitting instrument, an organic EL (OLED) light-emitting instrument, a fluorescent lamp, a semiconductor laser, and so on. The LED light-emitting device can be manufactured using the phosphor of the present invention and a publicly known method which is described in Japanese Patent Application Publication No. H05-152609, Japanese Patent Application Publication No. H07-99345, Japanese Patent No. 2927279, and the like. In this case, the light-emitting body or the emission source is preferably what emits light of a wavelength region of from 330 to 500 nm. In particular, an LED light-emitting element emitting an ultraviolet (or violet) ray of a wavelength region of 330 to 420 nm, or an LED light-emitting element emitting blue light in a wavelength region of 420 to 500 nm is preferable. Such LED light-emitting elements include a nitride semiconductor such as GaN or InGaN, which can be an emission source of a predetermined wavelength by adjusting the composition.

As a light-emitting device of the present invention, there are a white light-emitting diode, an illuminating device including a plurality of white light-emitting diodes, a backlight for a liquid crystal panel, and the like, which include the phosphor of the present invention, respectively.

In such light-emitting devices, in addition to the phosphor of the present invention, the device may further include one or two or more kinds of phosphor selected from β-sialon phosphor activated with Eu, α-sialon yellow phosphor activated with Eu, $Sr_2Si_5N_8$ orange phosphor activated with Eu, (Ca,Sr)AlSiN$_3$ orange phosphor activated with Eu, and CaAlSiN$_3$ red phosphor activated with Eu. As the yellow phosphor other than the above, for example, YAG:Ce, (Ca,Sr,Ba)Si$_2$O$_2$N$_2$:Eu, and the like may be used.

As one aspect of the light-emitting device of the present invention, there is a light-emitting device in which a light-emitting body or an emission source emits ultraviolet light or visible light having a peak wavelength of 300 to 450 nm such that the phosphor of the present invention emits light of blue-to-red color, which is mixed with light having a wavelength of 450 nm or more emitted by the other phosphor of the present invention such that the light-emitting device emits light of a white color or light of another color other than the white color.

As one aspect of the light-emitting device of the present invention, in addition to the phosphor of the present invention, a blue phosphor emitting light having a peak wavelength of 420 nm to 500 nm or less by means of the light-emitting body or the emission source can further be included. Specific examples of such a blue phosphor include AlN:(Eu, Si), BaMgAl$_{10}$O$_{17}$:Eu, SrSi$_9$Al$_{19}$O$_{31}$:Eu, LaSi$_9$Al$_{19}$N$_{32}$:Eu, α-sialon:Ce, JEM:Ce, and so on.

As one aspect of the light-emitting device of the present invention, in addition to the phosphor of the present invention, a green phosphor emitting light having a peak wavelength of 500 nm or more to 550 nm or less by means of the light-emitting body or the emission source can further be included. Specific examples of such a green phosphor include β-sialon:Eu, (Ba,Sr,Ca,Mg)$_2$SiO$_4$:Eu, (Ca,Sr,Ba) Si$_2$O$_2$N$_2$:Eu, and so on.

As one aspect of the light-emitting device of the present invention, in addition to the phosphor of the present invention, a yellow phosphor emitting light having a peak wavelength of 550 nm or more to 600 nm or less by mean of the light-emitting body or the emission source can further be included. Specific examples of such a yellow phosphor include YAG:Ce, α-sialon:Eu, CaAlSiN$_3$:Ce, La$_3$Si$_6$N$_{11}$:Ce, and so on.

As one aspect of the light-emitting device of the present invention, in addition to the phosphor of the present invention, a red phosphor emitting light having a peak wavelength of 600 nm or more to 700 nm or less by means of the light-emitting body or the emission source can be further included. Specific examples of such a red phosphor include $CaAlSiN_3$:Eu, $(Ca,Sr)AlSiN_3$:Eu, $Ca_2Si_5N_8$:Eu, $Sr_2Si_5N_8$:Eu, and so on.

As one aspect of the light-emitting device of the present invention, a light-emitting device with high efficiency can be configured since the emission efficiency is high if an LED emitting light having a wavelength of 320 to 450 nm is used as the light-emitting body or the emission source.

The image display device of the present invention is constituted of at least an excitation source and the phosphor of the present invention and includes a vacuum fluorescent display (VFD), a field emission display (FED), a plasma display panel (PDP), a cathode-ray tube (CRT), a liquid crystal display (LCD) and the like. It has been confirmed that the phosphor of the present invention emits light by excitation of a vacuum ultraviolet ray of 100 to 190 nm, an ultraviolet ray of 190 to 380 nm, an electron beam, or the like, and the above image display devices can be configured by combining these excitation sources and the phosphors of the present invention.

The phosphor comprising an inorganic compound crystal phase having a specific chemical composition as the main component according to the present invention has yellow or orange color as an object color, and thus can be used as a pigment or fluorescent pigment. That is, the object color of yellow or orange is observed when the phosphor of the present invention is irradiated with sunlight or light from a fluorescent lamp or the like. In view of a good coloring and no degradation over a long period of time, the phosphor of the present invention is suitable for an inorganic pigment. Therefore, when the phosphor of the present invention is used for a paint, ink, color, glaze, colorant to be added to a plastic product or the like, a favorable coloring can be maintained at a high level for a long period of time.

The nitride phosphor of the present invention absorbs ultraviolet light and therefore is suitable also as the ultraviolet absorber. Thus, when the nitride phosphor of the present invention is used as the paint or applied onto a surface of the plastic product or kneaded into an inside thereof, the nitride phosphor has a high effect on screening ultraviolet light to effectively allow protection of a product from ultraviolet degradation.

EXAMPLES

The present invention will be described in more detail with reference to the examples to be shown below, but these examples are disclosed only for the purpose of facilitating understanding the present invention readily such that the present invention is not limited to these examples.

[Raw Materials Used for Synthesis]

The raw material powders used for the synthesis were: silicon nitride powder with a particle size of specific surface area of 11.2 $m^2/g$, oxygen content of 1.29 wt %, and a type content of 95% (SN-E10 grade made by Ube Industries, Ltd.); silicon dioxide powder ($SiO_2$; made by Kojundo Chemical Laboratory Co., Ltd.); aluminum oxide powder with a particle size of specific surface area of 13.2 $m^2/g$ (TAIMICRON made by Taimei Chemicals Co., Ltd.); lithium carbonate (made by Kojundo Chemical Laboratory Co., Ltd.); boron nitride (made by DENKI KAGAKU KOGYO KABUSHIKI KAISHA); calcium oxide (made by Kojundo Chemical Laboratory Co., Ltd.); strontium nitride of 99.5% purity ($Sr_3N_2$; made by CERAC, Inc.); strontium oxide (made by Kojundo Chemical Laboratory Co., Ltd.); cerium oxide ($CeO_2$; with purity of 99.9% and made by Shin-Etsu Chemical Co., Ltd.); europium oxide ($Eu_2O_3$; with purity of 99.9% and made by Shin-Etsu Chemical Co., Ltd.); and rare earth oxide (purity of 99.9% made by Shin-Etsu Chemical Co., Ltd.).

[Synthesis and Structure Analysis of $Sr_3Si_8O_4N_{10}$ Crystal]

A mixture composition of silicon nitride ($Si_3N_4$); silicon oxide ($SiO_2$); and strontium oxide (SrO) in the molar ratios of 2.33:1:3 was designed. These raw material powders were weighed to be the above-mentioned mixture composition, and mixed for 5 minutes using a pestle and a mortar, each of them being made of sintered silicon nitride body. Next, the powder mixture obtained was fed into a crucible made of sintered boron nitride body. A bulk density of the powder mixture (powder) was approximately 33%.

The crucible containing the powder mixture was set into an electric furnace of a graphite resistance heating type. In the firing operation, first the firing atmosphere was made vacuum of $1 \times 10^{-1}$ Pa or less with a diffusion pump, and heated from the room temperature to 800° C. at a rate of 500° C. per hour. Nitrogen of 99.999 vol % purity was introduced at 800° C. to raise the pressure inside the furnace to 1 MPa, and the temperature was further raised to 1,700° C. at a rate of 500° C. per hour, and then the temperature was maintained for two (2) hours.

A synthesized compound was observed by means of an optical microscope and a crystal particle having a size of 9.8 μm×34 μm×2.8 μm was collected out of the synthesized compound. The crystal particle was analyzed using a scanning electron microscope (SEM; SU1510 made by Hitachi High-Technologies Corp.) equipped with an energy dispersive elemental analyzer (EDS; QUANTAX made by Bruker AXS Inc.) so as to perform the elemental analysis for the elements included in the crystal particle. As a result, presence of Sr, Si, O, and N elements was confirmed, and ratios of the respective number of contained atoms of Sr and Si were measured to be 3:8.

Next, the crystal was fixed to a tip top of a glass fiber with an organic adhesive. An X-ray diffraction measurement of the crystal was performed under a condition in which an output of an X-ray source was 50 kV and 50 mA using a single crystal X-ray diffractometer with a rotating anticathode of Mo Kα-line (SMART APEX II Ultra made by Bruker AXS Inc.). As a result, the crystal particle was confirmed to be a single crystal.

Next, the crystal structure of the crystal was determined using single crystal structure analysis software (APEX2 made by Bruker AXS Inc.) from the results of X-ray diffraction measurement. The crystal structure data obtained are shown in Table 1, and diagrams of the crystal structure are shown in FIG. 1. The crystal system, the space group, the lattice constants, and the kinds and positions of atoms are described in Table 1, and the shape and the size of the unit cell and the arrangement of atoms therein can be determined using the data. In addition, Si and Al enter in equivalent atom positions with a certain ratio, and oxygen and nitrogen enter in equivalent atom positions at a certain ratio, and when the ratios are averaged as a whole, the averaged ratio matches the composition fractions of the crystal.

It was found that the crystal belonged to the monoclinic system, and belonged to the space group $P2_1/n$ (space group No. 14 of the International Tables for Crystallography), and the lattice constants a, b, and c and angles α, β, and γ were determined as follows: a=0.4817 nm; b=2.42320 nm; c=1.05600 nm; angle α=90°; β=90.6°; and γ=90°. Further, the atom positions were determined as shown in Table 1. Here, in the table, O and N exist in the equivalent atom positions with a certain ratio which should be determined by the composition thereof. Also, while oxygen and nitrogen can occupy the seats where X can sit in the sialon system crystal in general, since Sr is +2 and Si is +4, if the atomic positions and an amount ratio of Sr and Si are given, the ratio of O and N which occupy (O, N) positions can be determined from the condition of the electrical neutrality of the crystal. The composition of the crystal obtained from Sr:Si ratio having been measured by means of EDS and crystal structure data was found to be $Sr_3Si_8O_4N_{10}$. Further, a difference between the starting material composition and the crystal composition might has been caused by formation of a small amount of a second phase having a composition other than $Sr_3Si_8O_4N_{10}$. However, the analysis results show a structure of pure $Sr_3Si_8O_4N_{10}$ because the single crystal was used in the measurement.

When a similar composition thereof was examined, the $Sr_3Si_8O_4N_{10}$ crystal was found to allow Li, Ca, or Ba to substitute partially or entirely Sr while the crystal structure remains the same. More specifically, the crystal of $A_3Si_8O_4N_{10}$ (A is one or two kinds of elements selected from Sr, Li, Ca, and Ba, or a mixture thereof) has a crystal structure identical to the crystal structure of the $Sr_3Si_8O_4N_{10}$ crystal. Further, with respect to the crystal, it was confirmed that Al could substitute partially Si, Si could substitute partially Al, and oxygen could substitute partially N, and that the crystal was one of the compositions of the inorganic crystals having the same crystal structure as $Sr_3Si_8O_4N_{10}$ does. Further, the crystal can also be described as compositions designated by: $Sr_3Si_{8-x}Al_xN_{10-x}O_{4+x}$, $Ca_3Si_{8-x}Al_xN_{10-x}O_{4+x}$, $(Sr,Li)_3Si_{8-x}Al_xN_{10-x}O_{4+x}$, $Ba_3Si_{8-x}Al_xN_{10-x}O_{4+x}$, $(Sr,Ba)_3Si_{8-x}Al_xN_{10-x}O_{4+x}$ (where $0 \leq x<8$), from the condition of electrical neutrality.

From the crystal structure data, it was confirmed that the crystal was a new substance having not been reported so far. A powder X-ray diffraction pattern calculated from the crystal structure data is shown in FIG. 2. Hereafter, it is possible to determine the formation of the $Sr_3Si_8O_4N_{10}$ system crystal as shown in FIG. 1 by performing a powder X-ray diffraction measurement of the synthesized compound and comparing the measured powder X-ray diffraction pattern with that of FIG. 2 to find they are the same. Further, since the powder X-ray pattern can be calculated from values of the lattice constants obtained from the powder X-ray diffraction measurement and the crystal structure data of Table 1 with respect to what retains the same crystal structure as the $Sr_3Si_8O_4N_{10}$ system crystal and has the varied lattice constants, the formation of the $Sr_3Si_8O_4N_{10}$ system crystal can be judged by comparing the measured pattern with the calculated pattern.

Phosphor Examples and Comparative Example

Examples 1 to 22

According to the design compositions as shown in Tables 2 and 3, raw materials were weighed to be raw material mixture compositions (mass ratios) as shown in Table 4. Although there may be a case in which a design composition in Tables 2 and 3 and a corresponding mixture composition in Table 4 show difference in the composition depending on the kind of each raw material to be used, the mixture composition was determined such that the amount of each metal ion matches therebetween in such a case. Weighed raw material powders were mixed for 5 minutes using a pestle and a mortar made of silicon nitride sintered body. Then, the powder mixture was fed into a crucible made of boron nitride sintered body. A bulk density of the powder body was approximately from 20% to 30%.

The crucible containing the powder mixture was set into an electric furnace of a graphite resistance heating type. In the firing operation, first the firing atmosphere was made vacuum of $1 \times 10^{-1}$ Pa or less with a diffusion pump, and heated from the room temperature to 800° C. at a rate of 500° C. per hour. Nitrogen of 99.999 vol % purity was introduced at 800° C. to raise the pressure inside the furnace to 1 MPa, and the temperature was further raised at a rate of 500° C. per hour up to each preset temperature as shown in Table 5, and then the temperature was maintained for two (2) hours.

TABLE 2

Design compositions (atomic ratio) in examples and comparative example

| Example | | M element | A element | | | E element | | D element | X element | |
| --- | --- | --- | --- | --- | --- | --- | --- | --- | --- | --- |
| | | | Li | Ca | Sr | Al | B | Si | O | N |
| Comparative example | 1 | | | | 3 | | | 8 | 4 | 10 |
| Example | 2 | Eu 0.05 | | 2.95 | | | | 8 | 4 | 10 |
| Example | 3 | Eu 0.05 | | | 2.95 | 0.5 | | 7.5 | 4.5 | 9.5 |
| Example | 4 | Eu 0.05 | | | 2.95 | 2 | | 6 | 6 | 8 |
| Example | 5 | Ce 0.02 | | | 2.98 | | | 8 | 4 | 10 |
| Example | 6 | Pr 0.02 | | | 2.98 | | | 8 | 4 | 10 |
| Example | 7 | Sm 0.02 | | | 2.98 | | | 8 | 4 | 10 |
| Example | 8 | Tb 0.02 | | | 2.98 | | | 8 | 4 | 10 |
| Example | 9 | Dy 0.02 | | | 2.98 | | | 8 | 4 | 10 |
| Example | 10 | Er 0.02 | | | 2.98 | | | 8 | 4 | 10 |
| Example | 11 | Yb 0.02 | | | 2.98 | | | 8 | 4 | 10 |
| Example | 12 | Ce 0.01 Eu 0.01 | | | 2.98 | | | 8 | 4 | 10 |
| Example | 13 | Eu 0.01 Tb 0.01 | | | 2.98 | | | 8 | 4 | 10 |
| Example | 14 | Eu 0.02 | | | 2.98 | | 0.01 | 8 | 4 | 10 |
| Example | 15 | Eu 0.02 | | 0.01 | 2.98 | | | 8 | 4 | 10 |
| Example | 16 | Eu 0.02 | | 0.1 | 2.98 | | | 8 | 4 | 10 |
| Example | 17 | Eu 0.02 | | | 3 | | | 8 | 4 | 10 |
| Example | 18 | Eu 0.02 | | | 4 | | | 8 | 5 | 10 |
| Example | 19 | Eu 0.02 | | | 5 | | | 8 | 6 | 10 |
| Example | 20 | Eu 0.02 | | | 3 | | | 6 | | 10 |
| Example | 21 | Eu 0.02 | | | 3 | | | 7 | 2 | 10 |
| Example | 22 | Eu 0.1 | | | 2.9 | | | 8 | 4 | 10 |

TABLE 3

Design compositions (parameter) in examples and comparative example

| Example | | M element (d) | | A element (e) | | | E element (g) | | D element (f) | X element (h) | |
|---|---|---|---|---|---|---|---|---|---|---|---|
| | | | | Li | Ca | Sr | Al | B | Si | O (h1) | N (h2) |
| Comparative example | 1 | | | | | 0.12 | | | 0.32 | 0.16 | 0.4 |
| Example | 2 | Eu | 0.002 | | 0.118 | | | | 0.32 | 0.16 | 0.4 |
| Example | 3 | Eu | 0.002 | | | 0.118 | 0.02 | | 0.3 | 0.18 | 0.38 |
| Example | 4 | Eu | 0.002 | | | 0.118 | 0.08 | | 0.24 | 0.24 | 0.32 |
| Example | 5 | Ce | 0.0008 | | | 0.1192 | | | 0.32 | 0.16 | 0.4 |
| Example | 6 | Pr | 0.0008 | | | 0.1192 | | | 0.32 | 0.16 | 0.4 |
| Example | 7 | Sm | 0.0008 | | | 0.1192 | | | 0.32 | 0.16 | 0.4 |
| Example | 8 | Tb | 0.0008 | | | 0.1192 | | | 0.32 | 0.16 | 0.4 |
| Example | 9 | Dy | 0.0008 | | | 0.1192 | | | 0.32 | 0.16 | 0.4 |
| Example | 10 | Er | 0.0008 | | | 0.1192 | | | 0.32 | 0.16 | 0.4 |
| Example | 11 | Yb | 0.0008 | | | 0.1192 | | | 0.32 | 0.16 | 0.4 |
| Example | 12 | Ce | 0.0004 Eu 0.0004 | | | 0.1192 | | | 0.32 | 0.16 | 0.4 |
| Example | 13 | Eu | 0.0004 Tb 0.0004 | | | 0.1192 | | | 0.32 | 0.16 | 0.4 |
| Example | 14 | Eu | 0.0008 | | | 0.119152 | | 0.0004 | 0.319872 | 0.159936 | 0.39984 |
| Example | 15 | Eu | 0.0008 | | 0.0004 | 0.119152 | | | 0.319872 | 0.159936 | 0.39984 |
| Example | 16 | Eu | 0.000797 | | 0.003984 | 0.118725 | | | 0.318725 | 0.159363 | 0.398406 |
| Example | 17 | Eu | 0.000799 | | | 0.119904 | | | 0.319744 | 0.159872 | 0.39968 |
| Example | 18 | Eu | 0.00074 | | | 0.148038 | | | 0.296077 | 0.185048 | 0.370096 |
| Example | 19 | Eu | 0.000689 | | | 0.172295 | | | 0.275672 | 0.206754 | 0.34459 |
| Example | 20 | Eu | 0.001052 | | | 0.157729 | | | 0.315457 | 0 | 0.525762 |
| Example | 21 | Eu | 0.000908 | | | 0.13624 | | | 0.317893 | 0.090827 | 0.454133 |
| Example | 22 | Eu | 0.004 | | | 0.116 | | | 0.32 | 0.16 | 0.4 |

TABLE 4

Raw material mixture compositions (mass ratios) in examples and comparative example

| Example | | $Si_3N_4$ | $SiO_2$ | $Al_2O_3$ | BN | $Li_2CO_3$ | CaO | SrO | $Sr_3N_2$ | $CeO_2$ |
|---|---|---|---|---|---|---|---|---|---|---|
| Comparative example | 1 | 46.88 | 8.6 | | | | | 44.52 | | |
| Example | 2 | 58.52 | 10.44 | | | | 29.48 | | | |
| Example | 3 | 43.36 | 8.33 | 3.62 | | | | 43.44 | | |
| Example | 4 | 33.09 | 8.25 | 14.36 | | | | 43.06 | | |
| Example | 5 | 46.63 | 8.76 | | | | | 44.12 | | 0.49 |
| Example | 6 | 46.63 | 8.76 | | | | | 44.12 | | |
| Example | 7 | 46.63 | 8.76 | | | | | 44.12 | | |
| Example | 8 | 46.61 | 8.75 | | | | | 44.1 | | |
| Example | 9 | 46.61 | 8.75 | | | | | 44.1 | | |
| Example | 10 | 46.61 | 8.75 | | | | | 44.1 | | |
| Example | 11 | 46.6 | 8.75 | | | | | 44.09 | | |
| Example | 12 | 46.74 | 8.63 | | | | | 44.13 | | 0.25 |
| Example | 13 | 46.73 | 8.63 | | | | | 44.12 | | |
| Example | 14 | 46.84 | 8.5 | | 0.04 | | | 44.13 | | |
| Example | 15 | 46.87 | 8.46 | | | 0.05 | | 44.12 | | |
| Example | 16 | 46.99 | 8.04 | | | 0.53 | | 43.95 | | |
| Example | 17 | 46.85 | 8.5 | | | | | 44.14 | | |
| Example | 18 | 40.81 | 7.41 | | | | | 51.35 | | |
| Example | 19 | 36.15 | 6.56 | | | | | 56.91 | | |
| Example | 20 | 48.96 | 0 | | | | | | 50.43 | |
| Example | 21 | 36.41 | 18.32 | | | | | 44.73 | | |
| Example | 22 | 46.77 | 8.1 | | | | | 42.64 | | |

Raw material mixture compositions (mass ratios)

| Example | | $Pr_6O_{11}$ | $Sm_2O_3$ | $Eu_2O_3$ | $Tb_4O_7$ | $Dy_2O_3$ | $Er_2O_3$ | $Yb_2O_3$ |
|---|---|---|---|---|---|---|---|---|
| Comparative example | 1 | | | 0 | | | | |
| Example | 2 | | | 1.57 | | | | |
| Example | 3 | | | 1.25 | | | | |
| Example | 4 | | | 1.24 | | | | |
| Example | 5 | | | | | | | |
| Example | 6 | 0.49 | | | | | | |
| Example | 7 | | 0.5 | | | | | |
| Example | 8 | | | | 0.53 | | | |
| Example | 9 | | | | | 0.53 | | |

TABLE 4-continued

Raw material mixture compositions (mass ratios) in examples and comparative example

| Example | | | | | |
|---|---|---|---|---|---|
| Example 10 | | | | 0.55 | |
| Example 11 | | | | | 0.56 |
| Example 12 | 0.25 | | | | |
| Example 13 | 0.25 | 0.27 | | | |
| Example 14 | 0.5 | | | | |
| Example 15 | 0.5 | | | | |
| Example 16 | 0.5 | | | | |
| Example 17 | 0.5 | | | | |
| Example 18 | 0.44 | | | | |
| Example 19 | 0.39 | | | | |
| Example 20 | 0.61 | | | | |
| Example 21 | 0.55 | | | | |
| Example 22 | 2.5 | | | | |

TABLE 5

Firing conditions in examples and comparative example

| | Firing conditions | | |
|---|---|---|---|
| Example | Temperature (° C.) | Ambient pressure (Mpa) | Time (hour) |
| Comparative example 1 | 1700 | 1 | 2 |
| Example 2 | 1700 | 1 | 2 |
| Example 3 | 1700 | 1 | 2 |
| Example 4 | 1700 | 1 | 2 |
| Example 5 | 1700 | 1 | 2 |
| Example 6 | 1700 | 1 | 2 |
| Example 7 | 1700 | 1 | 2 |
| Example 8 | 1700 | 1 | 2 |
| Example 9 | 1700 | 1 | 2 |
| Example 10 | 1700 | 1 | 2 |
| Example 11 | 1700 | 1 | 2 |
| Example 12 | 1700 | 1 | 2 |
| Example 13 | 1700 | 1 | 2 |
| Example 14 | 1700 | 1 | 2 |
| Example 15 | 1700 | 1 | 2 |
| Example 16 | 1700 | 1 | 2 |
| Example 17 | 1800 | 1 | 2 |
| Example 18 | 1800 | 1 | 2 |
| Example 19 | 1800 | 1 | 2 |
| Example 20 | 1800 | 1 | 2 |
| Example 21 | 1800 | 1 | 2 |
| Example 22 | 1800 | 1 | 2 |

Figure 3:
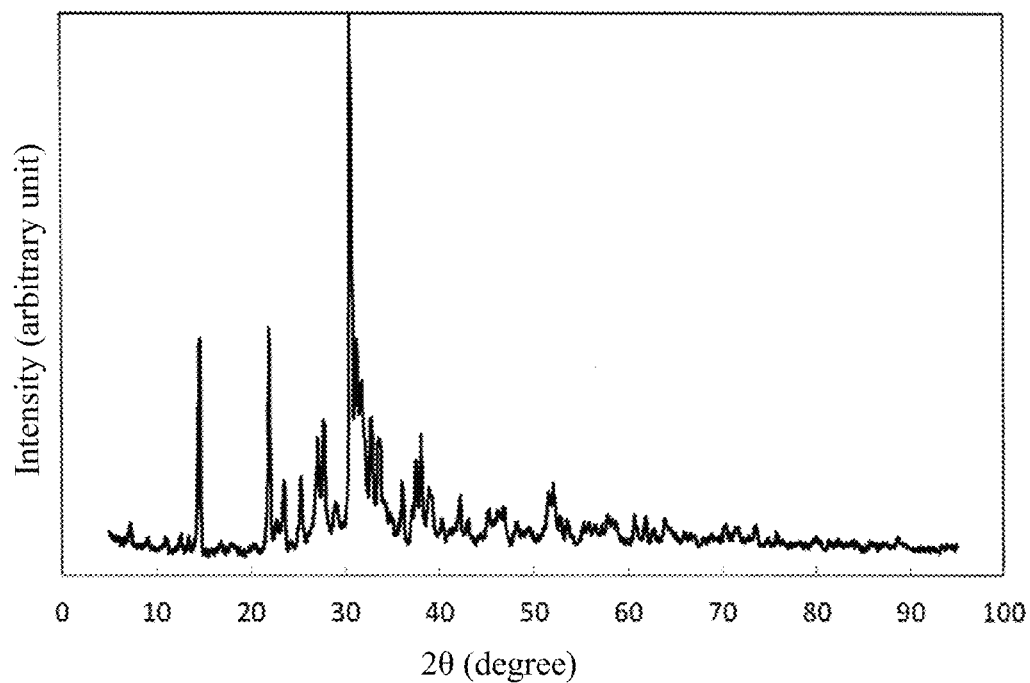
FIG. 3 is a diagram showing a resultant powder X-ray diffraction pattern of a synthesized compound in Example 22.

Next, each synthesized compound was ground using an agate mortar and the powder X-ray diffraction measurement using Cu Kα-line was carried out. The results are shown in FIG. 3 and main formation phases are shown in Table 6. Further, it was confirmed that the synthesized compounds included a rare earth element, an alkaline earth metal, Si, Al, O, and N by the EDS measurement. From the IPC mass spectrometry measurement, it was confirmed that the synthesized compounds included Li (Examples 15 and 16).

FIG. 3 is a diagram showing a resultant powder X-ray diffraction pattern of a synthesized compound in Example 22.

The XRD pattern in FIG. 3 matches well the X-ray diffraction pattern of $Sr_3Si_8O_4N_{10}$ crystal based on the structure analysis as shown in FIG. 2 such that it was confirmed that the main component of the synthesized compound was the crystal having the identical crystal structure to that of $Sr_3Si_8O_4N_{10}$ crystal. It was also confirmed that the synthesized compound of Example 22 included Eu, Sr, Si, O, and N and the ratios of Eu:Sr:Si were 0.1:2.9:8 by the EDS measurement. From the above description, it was confirmed that the synthesized compound of Example 22 was an inorganic compound of $Sr_3Si_8O_4N_{10}$ crystal into which Eu was solid-solved. Although not shown herein with respect to the other Examples, similar results were obtained in the same way.

TABLE 6

Main formation phases in examples and comparative example

| | Main formation phases | |
|---|---|---|
| Example | Main phase | Sub phase |
| Comparative example 1 | Crystal structure identical to that of Sr3Si8O4N10 | SrSi2O2N2 |
| Example 2 | Crystal structure identical to that of Sr3Si8O4N10 | SrSi2O2N2 |
| Example 3 | Crystal structure identical to that of Sr3Si8O4N10 | SrSi2O2N2 |
| Example 4 | Crystal structure identical to that of Sr3Si8O4N10 | SrAlSi5O2N7 |
| Example 5 | Crystal structure identical to that of Sr3Si8O4N10 | SrSi2O2N2 |
| Example 6 | Crystal structure identical to that of Sr3Si8O4N10 | SrSi2O2N2 |
| Example 7 | Crystal structure identical to that of Sr3Si8O4N10 | SrSi2O2N2 |
| Example 8 | Crystal structure identical to that of Sr3Si8O4N10 | SrSi2O2N2 |
| Example 9 | Crystal structure identical to that of Sr3Si8O4N10 | SrSi2O2N2 |
| Example 10 | Crystal structure identical to that of Sr3Si8O4N10 | SrSi2O2N2 |
| Example 11 | Crystal structure identical to that of Sr3Si8O4N10 | SrSi2O2N2 |
| Example 12 | Crystal structure identical to that of Sr3Si8O4N10 | SrSi2O2N2 |
| Example 13 | Crystal structure identical to that of Sr3Si8O4N10 | SrSi2O2N2 |
| Example 14 | Crystal structure identical to that of Sr3Si8O4N10 | SrSi2O2N2 |
| Example 15 | Crystal structure identical to that of Sr3Si8O4N10 | SrSi2O2N2 |
| Example 16 | Crystal structure identical to that of Sr3Si8O4N10 | SrSi2O2N2 |

TABLE 6-continued

Main formation phases in examples and comparative example

| Example | | Main phase | Sub phase |
|---|---|---|---|
| Example | 17 | Crystal structure identical to that of Sr3Si8O4N10 | Sr2Si5N8 |
| Example | 18 | Crystal structure identical to that of Sr3Si8O4N10 | |
| Example | 19 | Crystal structure identical to that of Sr3Si8O4N10 | |
| Example | 20 | Crystal structure identical to that of Sr3Si8O4N10 | Sr2Si5N8 |
| Example | 21 | Crystal structure identical to that of Sr3Si8O4N10 | |
| Example | 22 | Crystal structure identical to that of Sr3Si8O4N13 | |

As shown in Table 6, it was confirmed that the synthesized compounds of the examples according to the present invention had 20 mass % or more of a phase having the same crystal structure as $Sr_3Si_8O_4N_{10}$ crystal as the main formation phase. The difference between the mixed raw material composition and the chemical composition of the synthesized compound suggests that a slight amount of impurity second phase was mixed in the synthesized compound. Here, the main phase and the sub phase were quantitatively measured by the Rietveld analysis.

As mentioned above, it was confirmed that the synthesized compounds of examples according to the present invention were inorganic compounds comprising the $Sr_3Si_8O_4N_{10}$ system crystal into which the activating ion M such as Eu and Ce was solid-solved.

After thus-obtained fired body was crushed coarsely, it was further ground by hand using a crucible and mortar made of a silicon nitride sintered compact, and then the sample was allowed to pass a 30 μm-mesh sieve. When the particle size distribution was measured, the mean particle diameter was 3 to 8 μm.

Figure 4:
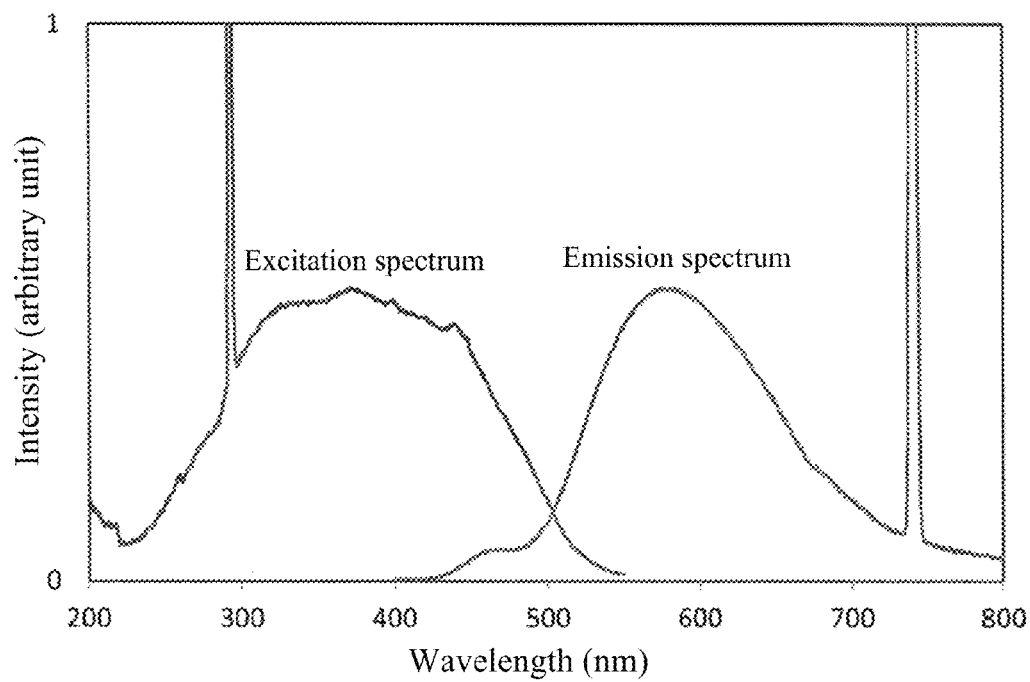
FIG. 4 is a diagram showing an excitation spectrum and an emission spectrum of a synthesized compound in Example 17.
Figure 5:
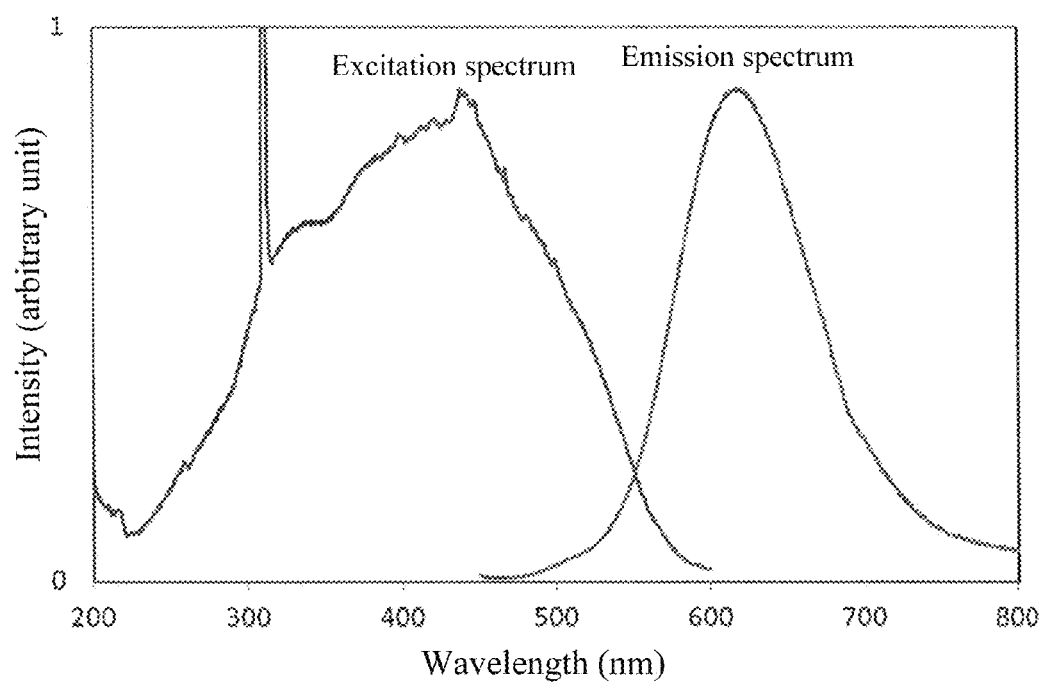
FIG. 5 is a diagram showing an excitation spectrum and an emission spectrum of a synthesized compound in Example 22.

As a result of irradiating light of wavelength of 365 nm emitted by the lamp onto these powder samples, it was confirmed that these powder samples emitted light of blue-to-red color. An emission spectrum and an excitation spectrum of the powder were measured using a spectrophotofluorometer. The results are shown in FIGS. 4 and 5. Peak wavelengths of the excitation spectra and peak wavelengths of the emission spectra are shown in Table 7.

FIG. 4 is a diagram showing an excitation spectrum and an emission spectrum of a synthesized compound in Example 17.

FIG. 5 is a diagram showing an excitation spectrum and an emission spectrum of the synthesized compound in Example 22.

TABLE 7

Excitation emission characteristics in examples and comparative example

| Example | | Excitation peak wavelength (nm) | Emission peak wavelength (nm) | Emission intensity (arbitrary unit) |
|---|---|---|---|---|
| Comparative example | 1 | | | Not emitted |
| Example | 2 | 370 | 560 | 0.48 |
| Example | 3 | 394 | 539 | 0.66 |
| Example | 4 | 319 | 479 | 0.33 |
| Example | 5 | 359 | 477 | 0.46 |
| Example | 6 | 376 | 537 | 0.07 |
| Example | 7 | 410 | 601 | 0.01 |
| Example | 8 | 257 | 379 | 0.29 |
| Example | 9 | 293 | 580 | 0.1 |
| Example | 10 | 375 | 539 | 1.02 |
| Example | 11 | 393 | 618 | 0.1 |
| Example | 12 | 373 | 535 | 0.9 |
| Example | 13 | 374 | 534 | 1.06 |
| Example | 14 | 377 | 537 | 1.05 |
| Example | 15 | 373 | 538 | 0.86 |
| Example | 16 | 373 | 537 | 0.99 |
| Example | 17 | 439 | 618 | 0.89 |
| Example | 18 | 365 | 560 | 0.45 |
| Example | 19 | 419 | 611 | 0.36 |
| Example | 20 | 442 | 611 | 2.02 |
| Example | 21 | 374 | 585 | 0.58 |
| Example | 22 | 372 | 580 | 0.53 |

According to FIG. 4, it was found that the synthesized compound in Example 17 could have been excited at 439 nm most efficiently, and that the emission spectrum upon excitation of 439 nm had a peak at 618 nm and exhibited red emission.

According to FIG. 5, it was found that the synthesized compound in Example 22 could have been excited at 372 nm most efficiently, and that the emission spectrum upon excitation of 372 nm had a peak at 580 nm and exhibited yellow emission.

It was confirmed that the emission colors of the synthesized compounds of Examples 17 and 22 were within the range of: 0.1≤x0≤0.7 and 0.2≤y0≤0.9 in the CIE 1931 chromaticity coordinates.

According to Table 7, it was confirmed that the synthesized compounds of the present invention could be excited by an ultraviolet ray of 300 nm to 380 nm and violet or blue light of 380 nm to 450 nm and were phosphors to emit blue-to-red light.

As mentioned above, it was found that the synthesized compounds of examples according to the present invention were inorganic compounds comprising the $Sr_3Si_8O_4N_{10}$ system crystal into which the activating ion M such as Eu and Ce was solid-solved and that the inorganic compounds were phosphors. According to Tables 3 and 7, it should be understood that a phosphor exhibiting yellow-to-red color emission having a peak in the wavelength range of 560 nm or more and 650 nm or less can be obtained by controlling the composition in a specific composition range.

Figure 6:
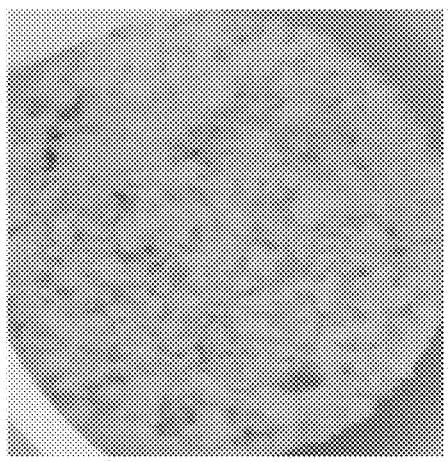
FIG. 6 is a diagram showing an object color (yellow or orange) of a synthesized compound in Example 17.

FIG. 6 is a diagram showing an object color of a synthesized compound in Example 17.

The object color of an orange color was observed when the synthesized compound of Example 17 was observed. It was also confirmed that the other examples showed the object color of yellow-to-orange color. The inorganic compounds of the synthesized compounds according to the present invention exhibited the object color of yellow or orange color by irradiation of the sunlight or an illumination such as a fluorescent lamp such that it was found that they could be utilized for the pigment or the fluorescent pigment.

Examples of Light-Emitting Device and Image Display Device

Examples 23 to 26

Next, a light-emitting device utilizing the phosphor of the present invention will be described.

Example 23

Figure 7:
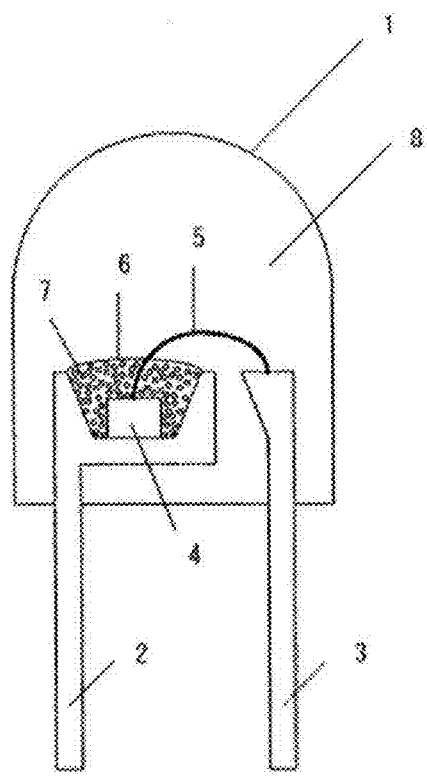
FIG. 7 is a schematic diagram showing an illuminating device (bullet-type of LED illuminating device) according to the present invention.

FIG. 7 is a schematic diagram showing an illuminating device (bullet-type of LED illuminating device) according to the present invention.

A so-called bullet-type white light-emitting diode lamp (1) shown in FIG. 7 was produced. There are two lead wires (2, 3), one of which (2) has a recess, in which an ultraviolet light-emitting diode element (4) having an emission peak of 365 nm is placed. The lower electrode of the ultraviolet light-emitting diode element (4) and the bottom surface of the recess are electrically connected with conductive paste, and the upper electrode and the other lead wire (3) are electrically connected through a gold thin wire (5). The phosphor (7) is dispersed in resin and mounted in the vicinity of the light-emitting diode element (4). The first resin (6) in which this phosphor is dispersed is transparent, and covers the entire ultraviolet light-emitting diode element (4). The tip-top portion of the lead wire including the recess, the blue light-emitting diode element, and the first resin in which the phosphor is dispersed are sealed with transparent second resin (8). A second resin (8) which is transparent is formed approximately in a cylindrical shape as a whole and the top portion is rounded in a lens shape such that the lamp is generally referred to as a bullet-type.

In the present embodiment, the yellow phosphor prepared for Example 22 and the blue phosphor of JEM:Ce were mixed at the mass ratio of 7:3 to make a phosphor powder, which was further mixed into epoxy resin at the concentration of 37 wt %, and this resultant mixture was dropped in an appropriate amount with a dispenser such that the first resin (6) was formed to have blended phosphor (7) dispersed therein. The light emitted by the thus-obtained light-emitting device had an emission color of white and characterized by x0=0.33 and y0=0.33 in the color coordinates.

Example 24

Figure 8:
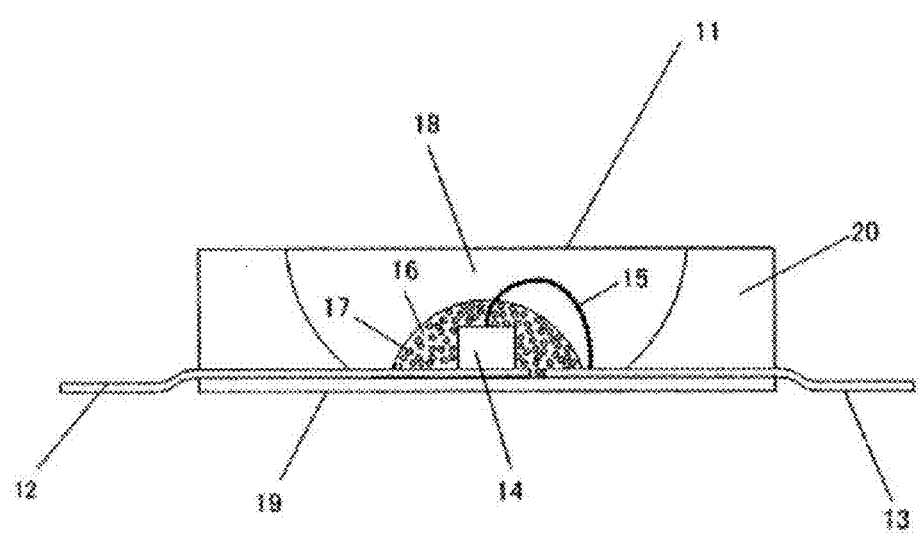
FIG. 8 is a schematic diagram showing an illuminating device (board-mounting-type LED illuminating device) according to the present invention.

FIG. 8 is a schematic diagram showing an illuminating device (board-mounting-type LED illuminating device) according to the present invention.

A chip-type white light-emitting diode lamp (11) for board-mounting as shown in FIG. 8 was produced. Two lead wires (12, 13) are fixed to a white alumina ceramic board (19) having high reflectance of visible light and one end of each of the wires is located at approximately the center portion of the board and the other end of each of the wires extends outside to serve as an electrode to be soldered when the lamp is mounted on the electric board. One of the lead wires (12) has the one end on which an blue light-emitting diode element (14) having an emission peak wavelength of 450 nm is placed and fixed thereto such that the element is located at the center of the board. The lower electrode of the blue light-emitting diode element (14) and the lead wire below are electrically connected with conductive paste, and the upper electrode and the other lead wire (13) are electrically connected to a gold thin wire (15).

A material prepared by mixing the first resin (16) and a blended phosphor (17) prepared by blending the phosphor prepared for Example 22 and a red phosphor of $CaAlSiN_3$: Eu with the mass ratio of 9 to 1 is mounted in the vicinity of the light-emitting diode element. The first resin in which this phosphor is dispersed is transparent, and covers the entire blue light-emitting diode element (14). Also, a wall surface member (20) having a hole opened at the center portion is fixed to the ceramic board. The wall surface member (20) has the center portion formed as the hole in which the blue light-emitting diode element (14) and the resin (16) having the phosphor (17) dispersed therein are contained and the portion of the hole facing the center is made to be a slope. This slope is a reflective surface for taking out light forward, and the shape of the curved surface of the slope is determined in consideration of the direction of light reflection. Further, at least the surface which constitutes the reflective surface forms a surface having high visible light reflectance with white color or metallic luster. In the present example, the wall surface member (20) is configured with white silicone resin. The hole at the center portion of the wall surface member is formed with a recess as the final shape of the chip-type light emitting diode lamp, and is filled up with second transparent resin (18) to seal all of the blue light-emitting diode element (14) and the first resin (16) in which the phosphor (17) is dispersed. In the present example, the same epoxy resin was used for both the first resin (16) and second resin (18). The percentage of phosphor addition, the attained chromaticity, and the like are approximately identical to those in Example 23.

Next, an example of design of an image display device using the phosphor of the present invention is described.

Example 25

Figure 9:
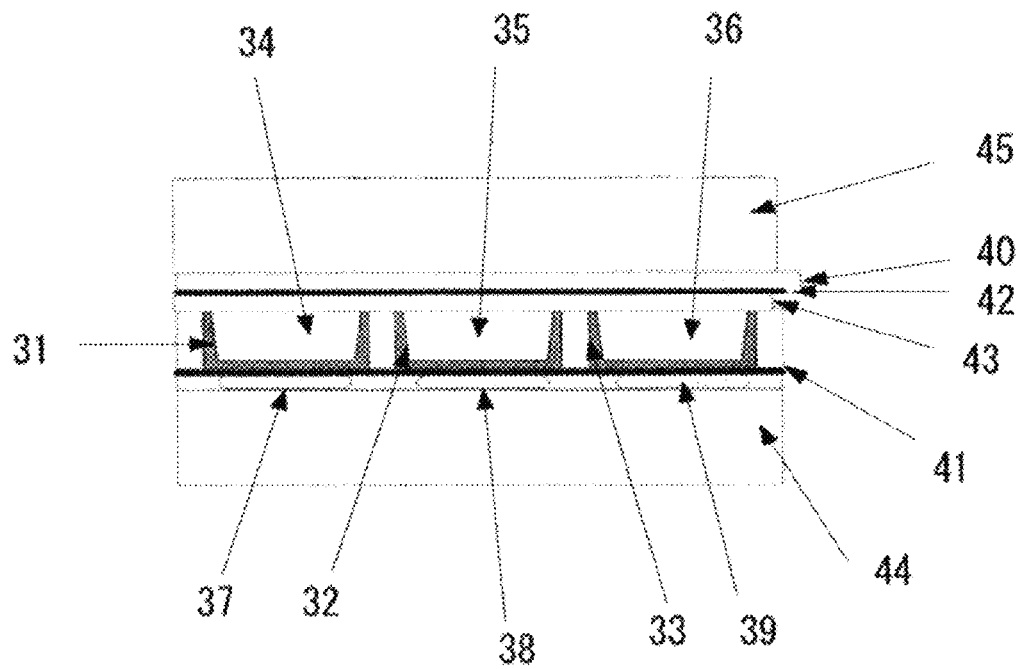
FIG. 9 is a schematic diagram showing an image display device (plasma display panel) according to the present invention.

FIG. 9 is a schematic diagram showing an image display device (plasma display panel) according to the present invention.

A red phosphor ($CaAlSiN_3$:Eu) (31), a green phosphor (32) of Example 13 according to the present invention, and the blue phosphor (BAM:$Eu^{2+}$) (33) are applied to inner surfaces of the respective cells (34, 35, 36), which are arranged via electrodes (37, 38, 39) and a dielectric layer

(41) over a glass board (44). If electric power is supplied to the electrodes (37, 38, 39, 40), a vacuum ultraviolet ray is generated by Xe discharge in each of the cells, thereby exciting the respective phosphors so as to emit visible light of a red color, a green color, or a blue color such that the emitted light may be observed from the outside through a protective layer (43), a dielectric layer (42), and a glass board (45) so as to serve as an image display.

Example 26

Figure 10:
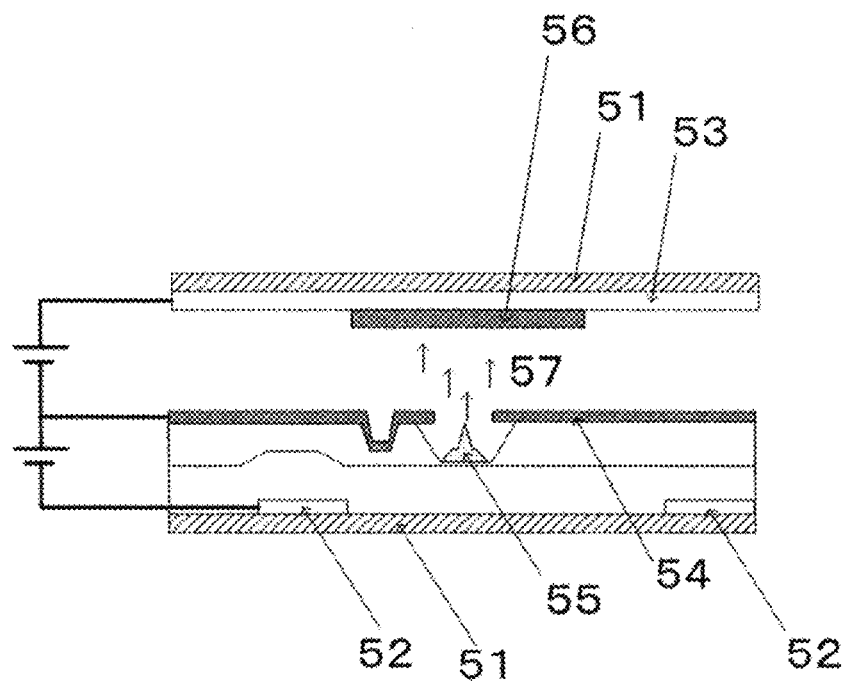
FIG. 10 is a schematic diagram showing an image display device (field emission display panel) according to the present invention.

FIG. 10 is a schematic diagram showing an image display device (field emission display panel) according to the present invention.

The red phosphor (56) of Example 20 of the present invention is applied to an interior surface of an anode (53). By applying a voltage between a cathode (52) and a gate (54), electrons (57) are emitted from an emitter (55). The electrons are accelerated by the voltage between the anode (53) and the cathode, and impinge on the red phosphor (56) to excite the phosphor to emit light. The entire device is protected by a glass (51). Although the drawing shows a single light emission cell comprising one emitter and one phosphor, a display is actually configured to emit light of a variety of color by arranging many cells for a green color and a blue color in addition to for the red color. Although the phosphors used for green and blue cells are not particularly specified, a phosphor which shows high brightness under a low speed electron beam is preferable.

INDUSTRIAL APPLICABILITY

The nitride phosphor of the present invention has different emission characteristics (emission color and excitation characteristics, emission spectrum) from those of the conventional phosphor, exhibits high emission intensity in the case where it is combined with a LED of 470 nm or less, is chemically and thermally stable, and further has little degradation in the intensity of the phosphor when it is exposed to the excitation source such that it is a nitride phosphor to be used suitably for the VFD, the FED, the PDP, the CRT, and the white LED. It is expected that the phosphor of the present invention will be utilized in material design in various kinds of display devices so as to contribute to the development of the industry.

EXPLANATION OF NUMERALS 1 bullet-type light-emitting diode lamp
2, 3 lead wire
4 light-emitting element
5 bonding wire
6, 8 resin
7 phosphor
11 chip-type white light-emitting diode lamp for board-mounting
12, 13 lead wire
14 light-emitting element
15 bonding wire
16, 18 resin
17 phosphor
19 alumina ceramic board
20 wall surface member
31 red phosphor
32 green phosphor
33 blue phosphor
34, 35, 36 ultraviolet ray emission cell
37, 38, 39, 40 electrode
41, 42 dielectric layer
43 protective layer
44, 45 glass substrate
51 glass
52 cathode
53 anode
54 gate
55 emitter
56 phosphor
57 electrons

What is claimed is:

1. A phosphor comprising: an inorganic compound comprising:
a crystal represented by $Sr_3Si_8O_4N_{10}$ or an inorganic crystal having an identical crystal structure to a crystal structure of the crystal represented by $Sr_3Si_8O_4N_{10}$, into which M element is solid-solved (here, M is one or more kinds of elements selected from the group consisting of Mn, Ce, Pr, Nd, Sm, Eu, Tb, Dy, and Yb),
wherein the inorganic crystal comprises: at least A element, D element, and X element (here, A is one or more kinds of elements selected from the group consisting of Li, Mg, Ca, Sr, and Ba; D is one or more kinds of elements selected from the group consisting of Si, Ge, Sn, Ti, Zr, and Hf; and X is one or more kinds of elements selected from the group consisting of O, N, and F),
wherein the inorganic crystal, if necessary, comprises: E element (here, E is one or more kinds of elements selected from the group consisting of B, Al, Ga, In, Sc, Y, and La), and
wherein the inorganic crystal is a crystal having a composition represented by $A_3D_8X_{14}$ or $A_3(D, E)_8X_{14}$.

2. The phosphor according to claim 1, wherein the A element comprises at least Sr or Ca; the D element comprises at least Si; the X element comprises at least N or a combination of N and O; and the E element comprises at least Al.

3. The phosphor according to claim 1, wherein the inorganic crystal is a crystal of $Ca_3Si_8O_4N_{10}$.

4. The phosphor according to claim 1, wherein the inorganic crystal is represented by a composition formula of $Sr_3Si_{8-x}Al_xN_{10-x}O_{4+x}$, or $Ca_3Si_{8-x}Al_xN_{10-x}O_{4+x}$, (where $0 \le x \le 8$).

5. The phosphor according to claim 1, wherein the M element is Eu.

6. The phosphor according to claim 1, wherein the inorganic crystal is a crystal in a monoclinic system.

7. The phosphor according to claim 1, wherein the inorganic crystal is a crystal in a monoclinic system and has a symmetry in a space group $P2_1/n$, and lattice constants a, b, and c have values in following ranges:
a=0.48170±0.05 nm;
b=2.42320±0.05 nm; and
c=1.05600±0.05 nm.

8. The phosphor according to claim 1,
wherein:
the inorganic compound is represented by a composition formula of $M_dA_eD_fE_gX_h$ (here, d+e+f+g+h=1 in the formula;
M is one or more kinds of elements selected from the group consisting of Mn, Ce, Pr, Nd, Sm, Eu, Tb, Dy, and Yb;
A is one or more kinds of elements selected from the group consisting of Li, Mg, Ca, Sr, and Ba;
D is one or more kinds of elements selected from the group consisting of Si, Ge, Sn, Ti, Zr, and Hf;

E is one or more kinds of elements selected from the group consisting of B, Al, Ga, In, Sc, Y, and La; and X is one or more kinds of elements selected from the group consisting of O, N, and F), and wherein parameters d, e, f, g, and h satisfy all following conditions:

$0.00001 \leq d \leq 0.05$;

$0.05 \leq e \leq 0.3$;

$0.15 \leq f \leq 0.4$;

$0 \leq g \leq 0.15$; and $0.45 \leq h \leq 0.65$.

9. The phosphor according to claim 8, wherein values of the parameters d, e, f, g, and h are within a range satisfying all conditions of:

$$d+e=(3/25)\pm 0.05;$$

$$f+g=(8/25)\pm 0.05; \text{ and}$$

$$h=(14/25)\pm 0.05.$$

10. The phosphor according to claim 8, wherein values of the parameters f and g satisfy a condition of: $3/8 \leq f/(f+g) \leq 8/8$.

11. The phosphor according to claim 8, wherein:

the X element includes N and O, the inorganic compound is represented by a composition formula of $M_d A_e D_f E_g O_{h1} N_{h2}$ (here, d+e+f+g+h1+h2=1 and h1+h2=h in the formula), and a condition of $0 \leq h1/(h1+h2) \leq 8/14$ is satisfied.

12. The phosphor according to claim 8, wherein the M element includes at least Eu.

13. The phosphor according to claim 8, wherein:

the A element includes at least Sr or Ca, the D element includes at least Si, the E element includes at least Al if necessary, and the X element includes at least O and N.

14. The phosphor according to claim 1, wherein the inorganic compound is represented by a composition formula of: $Eu_y Sr_{3-y} Si_{8-x} Al_x N_{10-x} O_{4+x}$, or $Eu_y Ca_{3-y} Si_{8-x} Al_x N_{10-x} O_{4+x}$, and wherein $0 \leq x < 8$ and $0.0001 \leq y \leq 2$.

15. The phosphor according to claim 1, wherein the phosphor emits fluorescence having a peak in a wavelength range of at least 560 nm and not exceeding 650 nm upon irradiation of an excitation source.

16. The phosphor according to claim 15, wherein the excitation source is an electron beam; an X-ray or light having a wavelength that is at least 100 nm and not exceeding 450 nm, the light being vacuum ultraviolet rays, ultraviolet rays or visible light.

17. The phosphor according to claim 1, wherein Eu is solid-solved into the crystal or the inorganic crystal and wherein the phosphor emits fluorescence of yellow to red color having a wavelength of at least 560 nm and not exceeding 650 nm upon irradiation of light having a wavelength from 360 nm to 450 nm.

18. The phosphor according to claim 1, wherein a color of light emitted upon irradiation of an excitation source satisfies, in terms of values of (x0, y0) of CIE 1931 chromaticity coordinates, conditions:

$0.1 \leq x0 \leq 0.7$; and $0.2 \leq y0 \leq 0.9$.

19. A method of manufacturing a phosphor comprising:

firing a mixture of metal compounds being raw material mixture, which constitutes an inorganic compound of the phosphor according to claim 1 by firing the mixture, in a temperature range of at least 1,200° C. and not exceeding 2,200° C. in an inert atmosphere including nitrogen.

20. A light-emitting device comprising at least a light-emitting body and a phosphor (first phosphor), wherein the phosphor recited in claim 1 is used as the phosphor (first phosphor).

21. The light-emitting device according to claim 20, wherein the light-emitting body is an organic EL light-emitting body (OLED), a semiconductor laser, a laser diode (LD), or a light-emitting diode (LED) wherein any of the organic EL light-emitting body (OLED), the semiconductor laser, the laser diode (LD), and the light-emitting diode (LED) emits light of a wavelength of 330 to 500 nm.

22. The light-emitting device according to claim 20, wherein the light-emitting device is a white light-emitting diode, an illuminating device including a plurality of white light-emitting diodes, or a backlight for a liquid crystal panel.

23. The light-emitting device according to claim 20, wherein the light-emitting body emits ultraviolet or visible light having a peak wavelength of 300 to 450 nm, and the light-emitting device emits white light or light other than the white light by mixing light emitted by the phosphor recited in claim 1 and light having a wavelength of 450 nm or more emitted by another phosphor.

24. The light-emitting device according to claim 20, further comprising a blue phosphor being caused to emit light having a peak wavelength of 420 nm to 500 nm or less by the light-emitting body.

25. The light-emitting device according to claim 24, wherein the blue phosphor is selected from a group consisting of AlN: (Eu, Si), $BaMgAl_{10}O_{17}$:Eu, $SrSi_9Al_{19}ON_{31}$:Eu, $LaSi_9Al_{19}N_{32}$:Eu, α-sialon:Ce, and JEM:Ce.

26. The light-emitting device according to claim 20, further comprising a green phosphor being caused to emit light having a peak wavelength of at least 500 nm and not exceeding 550 nm by the light-emitting body.

27. The light-emitting device according to claim 26, wherein the green phosphor is selected from a group consisting of β-sialon:Eu, $(Ba,Sr,Ca,Mg)_2SiO_4$:Eu, and $(Ca,Sr,Ba)Si_2O_2N_2$:Eu.

28. The light-emitting device according to claim 20, further comprising a yellow phosphor being caused to emit light having a peak wavelength of at least 550 nm and not exceeding 600 by the light-emitting body.

29. The light-emitting device according to claim 28, wherein the yellow phosphor is selected from a group consisting of YAG: Ce, α-sialon:Eu, $CaAlSiN_3$:Ce, and $La_3Si_6N_{11}$:Ce.

30. The light-emitting device according to claim 20, further comprising a red phosphor being caused to emit light having a peak wavelength of at least 600 nm and not exceeding 700 nm by the light-emitting body.

31. The light-emitting device according to claim 30, wherein the red phosphor is selected from a group consisting of $CaAlSiN_3$:Eu, $(Ca,Sr)AlSiN_3$:Eu, $Ca_2Si_5N_8$:Eu, and $Sr_2Si_5N_8$:Eu.

32. An image display device comprising: an excitation source and a phosphor (first phosphor), wherein at least the phosphor recited in claim 1 is used as the phosphor (first phosphor).

33. The image display device according to claim 32, wherein the image display device is a fluorescent display tube (VFD), a field emission display (FED), a plasma display panel (PDP), a cathode-ray tube (CRT), or a liquid crystal display (LCD).

34. A pigment comprising an inorganic compound recited in the phosphor of claim 1.

35. An ultraviolet absorber comprising an inorganic compound recited in the phosphor of claim 1.

* * * * *